(12) United States Patent
Park et al.

(10) Patent No.: US 12,047,696 B2
(45) Date of Patent: *Jul. 23, 2024

(54) PIXEL AND IMAGE SENSOR INCLUDING THE SAME

(71) Applicant: Samsung Electronics Co., Ltd., Suwon-si (KR)

(72) Inventors: Seokyong Park, Hwaseong-si (KR); Kyungmin Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/350,461

(22) Filed: Jul. 11, 2023

(65) Prior Publication Data

US 2023/0353895 A1 Nov. 2, 2023

Related U.S. Application Data

(63) Continuation of application No. 17/833,397, filed on Jun. 6, 2022, now Pat. No. 11,743,610.

(30) Foreign Application Priority Data

Jun. 21, 2021 (KR) .................. 10-2021-0080392

(51) Int. Cl.
*H04N 25/59* (2023.01)
*H01L 27/146* (2006.01)
*H04N 25/766* (2023.01)

(52) U.S. Cl.
CPC ....... *H04N 25/59* (2023.01); *H01L 27/14612* (2013.01); *H04N 25/766* (2023.01); *H01L 27/14643* (2013.01)

(58) Field of Classification Search
CPC ...... H04N 25/59; H04N 25/766; H04N 25/60; H04N 25/709; H04N 25/778;
(Continued)

(56) References Cited

U.S. PATENT DOCUMENTS 6,587,142 B1 7/2003 Kozlowski et al.
7,075,049 B2 7/2006 Rhodes et al.
(Continued)

FOREIGN PATENT DOCUMENTS

EP 3419280 A1 12/2018
WO WO-2017/163890 A1 9/2017

OTHER PUBLICATIONS

Extended European Search Report dated Nov. 10, 2022 for corresponding European Application No. 22178913.4.

*Primary Examiner* — Shahbaz Nazrul
(74) *Attorney, Agent, or Firm* — Harness, Dickey & Pierce, P.L.C.

(57) ABSTRACT

A unit pixel circuit includes a first photodiode, a second photodiode different from the first photodiode, a first floating diffusion node in which charges generated in the first photodiode are accumulated, a second floating diffusion node in which charges generated in the second photodiode are accumulated, a capacitor connected to the first floating diffusion node and a first voltage node, and accumulating overflowed charges of the first photodiode, a first switch transistor connecting the first floating diffusion node to a third floating diffusion node, a reset transistor connecting the third floating diffusion node to a second voltage node, a gain control transistor connecting the second floating diffusion node to the third floating diffusion node, and a second switch transistor connected to the first voltage node and the second voltage node.

18 Claims, 17 Drawing Sheets

(58) Field of Classification Search
CPC ...... H04N 25/585; H04N 25/75; H04N 25/79; H01L 27/14612; H01L 27/14643
See application file for complete search history.

(56) References Cited

U.S. PATENT DOCUMENTS

| | | | |
|---|---|---|---|
| 8,575,533 | B2 | 11/2013 | Yen et al. |
| 8,896,733 | B2 | 11/2014 | Solhusvik |
| 8,913,166 | B2 | 12/2014 | Okita |
| 9,277,147 | B2 | 3/2016 | Beck |
| 10,044,960 | B2 | 8/2018 | Mao et al. |
| 10,397,500 | B1 * | 8/2019 | Xu ..................... H04N 25/585 |
| 10,791,292 | B1 | 9/2020 | Geurts |
| 2018/0191973 | A1 * | 7/2018 | Hirota ................... H04N 25/76 |
| 2020/0137325 | A1 | 4/2020 | Mori et al. |
| 2020/0235152 | A1 | 7/2020 | Lee et al. |
| 2020/0252564 | A1 | 8/2020 | Palubiak |
| 2020/0260025 | A1 | 8/2020 | Seo et al. |
| 2021/0274119 | A1 | 9/2021 | Nakamura |
| 2022/0210353 | A1 * | 6/2022 | Velichko ............. H04N 25/771 |
| 2022/0217291 | A1 | 7/2022 | Kim et al. |
| 2022/0272289 | A1 | 8/2022 | Oh et al. |
| 2022/0337777 | A1 | 10/2022 | Shim et al. |
| 2023/0076177 | A1 | 3/2023 | Lim et al. |
| 2023/0088705 | A1 | 3/2023 | Lim |
| 2023/0122582 | A1 * | 4/2023 | Choi ..................... H10K 39/15 348/308 |
| 2023/0134685 | A1 * | 5/2023 | Lim ...................... H04N 25/77 348/311 |

\* cited by examiner

PIXEL AND IMAGE SENSOR INCLUDING THE SAME

CROSS-REFERENCE TO RELATED APPLICATIONS

This application is a continuation of U.S. application Ser. No. 17/833,397, filed Jun. 6, 2022, which is based on and claims priority under 35 U.S.C. § 119 to Korean Patent Application No. 10-2021-0080392, filed on Jun. 21, 2021, in the Korean Intellectual Property Office, the disclosure of each of which is incorporated by reference herein in its entirety.

BACKGROUND

The inventive concepts relate to a pixel, and more particularly, to a pixel providing improved reset time, and an image sensor including the pixel.

An image sensor is a device capturing a two-dimensional (2D) or three-dimensional (3D) image of an object. The image sensor generates an image of an object by using a photoelectric conversion element which reacts according to the intensity of light reflected from the object. With advances in the complementary metal-oxide semiconductor (CMOS) technologies, CMOS image sensors using a CMOS have been widely used. In recent years, technologies of adding a capacitor to a floating diffusion node have been developed to increase a dynamic range and mitigate light emitting diode (LED) flicker of an image sensor.

SUMMARY

The inventive concepts provide a pixel which reduces a time constant and reset time by electrically connecting voltage nodes, and an image sensor including the pixel.

According to some example embodiments of the inventive concepts, a unit pixel circuit may include a first photodiode, a second photodiode different from the first photodiode, a first floating diffusion node configured to accumulate charges generated in the first photodiode, a second floating diffusion node configured to accumulate charges generated in the second photodiode, a capacitor connected to the first floating diffusion node and a first voltage node and configured to accumulate overflowed charges of the first photodiode, a first switch transistor connecting the first floating diffusion node to a third floating diffusion node, a reset transistor connecting the third floating diffusion node to a second voltage node, a gain control transistor connecting the second floating diffusion node to the third floating diffusion node, and a second switch transistor connected to both the first voltage node and the second voltage node.

According to some example embodiments of the inventive concepts, an image sensor may include a pixel array in which a plurality of pixels implemented in a first chip are arranged, and a logic circuit implemented in a second chip forming a stacked structure with the first chip, wherein each of the plurality of pixels includes a first photodiode, a second photodiode different from the first photodiode, a first floating diffusion node configured to accumulate charges generated in the first photodiode, a second floating diffusion node configured to accumulate charges generated in the second photodiode, a capacitor connected to the first floating diffusion node and a first voltage node and configured to accumulate overflowed charges of the first photodiode, a first switch transistor connecting the first floating diffusion node to a third floating diffusion node, a reset transistor connecting the third floating diffusion node to a second voltage node, a gain control transistor connecting the second floating diffusion node to the third floating diffusion node, a second switch transistor connected to the first voltage node and the second voltage node, and a driver transistor configured to convert charges accumulated in the first floating diffusion node and the second floating diffusion node into pixel signals. The logic circuit may be configured to generate control signals respectively controlling each of the first switch transistor, the reset transistor, the gain control transistor, the second switch transistor, and the driver transistor, and the logic circuit may further include a row driver configured to transmit the control signals to the pixel array of the first chip.

According to some example embodiments of the inventive concepts, a unit pixel circuit may include a photodiode, a first floating diffusion node configured to accumulate charges generated in the photodiode, a capacitor connected to the first floating diffusion node and a first voltage node and configured to accumulate overflowed charges of the photodiode, a switch transistor connecting the first floating diffusion node to a second floating diffusion node, a reset transistor connecting the second floating diffusion node to a second voltage node, and a second switch transistor connected to the first voltage node and the second voltage node.

According to some example embodiments of the inventive concepts, a unit pixel circuit may include a photodiode, a first floating diffusion node configured to accumulate charges generated in the photodiode, a gain control transistor connecting the first floating diffusion node to a second floating diffusion node, a capacitor connecting the second floating diffusion node and a first voltage node and configured to provide a low conversion gain mode based on a turn-on of the gain control transistor and a high conversion gain mode based on a turn-off of the gain control transistor, a reset transistor connecting the second floating diffusion node to a second voltage node, and a switch transistor connected to the first voltage node and the second voltage node.

According to some example embodiments of the inventive concepts, an image sensor may include a pixel array including a plurality of unit pixels connected to each other in parallel, and a logic circuit including a row driver for transmitting a control signal to the pixel array. Each of the plurality of unit pixels may include a photodiode, a first floating diffusion node configured to accumulate charges generated in the photodiode, a capacitor connected to the first floating diffusion node and a first voltage node, the capacitor configured to accumulate overflowed charges of the photodiode, a switch transistor connecting the first floating diffusion node to a second floating diffusion node, a reset transistor connecting the second floating diffusion node to a second voltage node, and a second switch transistor connected to the first voltage node and the second voltage node. The pixel array may further include a first switch connecting a first voltage node of a first unit pixel most adjacent to the row driver among the plurality of unit pixels to a second voltage node of the first unit pixel, and a second switch connecting a first voltage node of an Nth unit pixel most distanced from the row driver among the plurality of unit pixels to a second voltage node of the Nth unit pixel.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
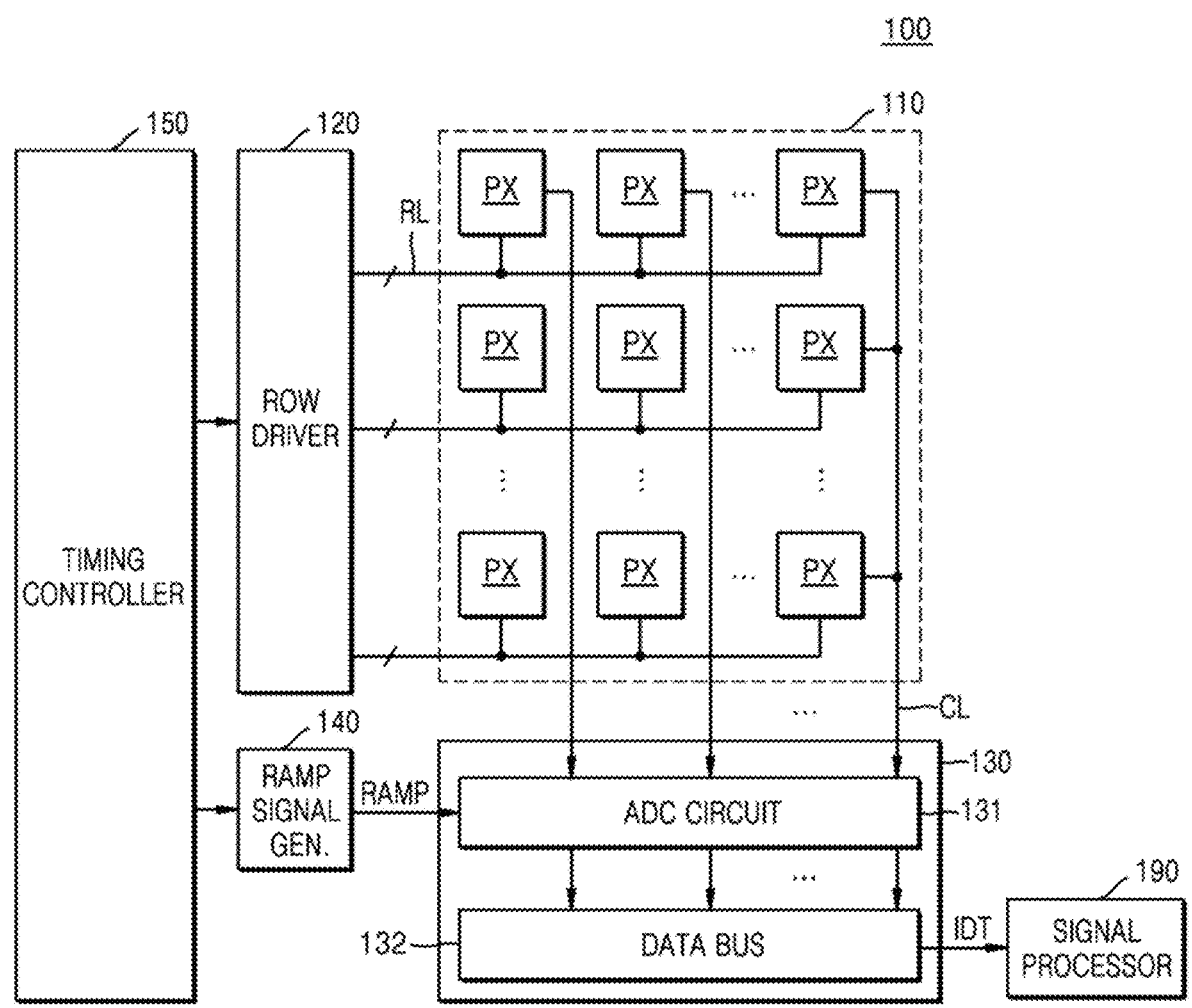
FIG. 1 is a block diagram of an image sensor according to some example embodiments.

Hereinafter, example embodiments of the inventive concepts will be described in detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a block diagram of an image sensor according to some example embodiments.

An image sensor 100 may be equipped in an electronic device having an image or optical sensing function. For example, the image sensor 100 may be provided in electronic devices, such as cameras, smartphones, wearable devices, Internet of Things (IoT) devices, home appliances, tablet personal computers (PC), personal digital assistants (PDA), portable multimedia players (PMP), navigations, drones, advanced drivers assistance systems (ADAS), etc. The image sensor 100 may also be provided as a component in vehicles, furniture, manufacturing equipment, doors, various measurement devices, etc.

With reference to FIG. 1, the image sensor 100 may include a pixel array 110, a row driver 120, a read-out circuit 130, a ramp signal generator 140, a timing controller 150, and a signal processor 190, and the read-out circuit 130 may include an analog-digital conversion circuit 131 (hereinafter, an "ADC circuit") and a data bus 132.

The pixel array 110 may include a plurality of row lines RL, a plurality of column lines CL, and a plurality of pixels PX connected to the plurality of row lines RL and the plurality of column lines CL and arranged in rows and columns. The plurality of pixels PX may be an active pixel sensor (APS).

Each of the plurality of pixels PX may include at least one photoelectric conversion element, and the pixels PX may sense light by using the photoelectric conversion element, and output an image signal, which is an electronic signal, according to the sensed light. For example, the photoelectric conversion element may be a light sensing element including organic materials or inorganic materials, such as an inorganic photodiode, an organic photodiode, a perovskite photodiode, a phototransistor, a photogate, a pinned photodiode, etc. In some example embodiments, each of the plurality of pixels PX may include a plurality of photoelectric conversion elements.

In addition, a micro lens for concentrating light may be arranged at the top of each of the plurality of pixels PX, or at the top of each of pixel groups consisting of adjacent pixels PX. Each of the plurality of pixels PX may sense light of a specific spectral band from light received through the micro lens. For example, the pixel array 110 may include a red pixel converting light of the red spectral region into an electronic signal, a green pixel converting light of the green spectral region into an electronic signal, and a blue pixel converting light of the blue spectral region into an electronic signal. A color filter array for transmitting light of a specific spectral region may be arranged at the top of the plurality of pixels PX, and a color to be sensed by a pixel may be determined according to a color filter arranged at the top of each of the plurality of pixels. However, the inventive concepts are not limited thereto. In some example embodiments, a specific photoelectric conversion element may convert light of a specific wavelength band into an electronic signal according to a level of an electronic signal applied to the specific photoelectric conversion element.

In some example embodiments, the plurality of pixels PX may have a multi-layer structure. The pixels PX having a multi-layer structure may include a plurality of stacked photoelectric conversion elements that convert light of different spectral regions into electronic signals, and the electronic signals respectively corresponding to different colors may be generated from the plurality of photoelectric conversion elements. In other words, the electronic signals corresponding to a plurality of colors may be output from one pixel PX.

The row driver 120 may drive the pixel array 110 by units of rows. The row driver 120 may decode a row control signal (e.g., an address signal) received from the timing controller 150, and select at least one of the row lines constituting the pixel array 110 in response to the decoded row control signal. For example, the row driver 120 may generate a selection signal for selecting one of a plurality of rows. Then, the pixel array 110 may output a pixel signal from a row selected according to the selection signal provided from the row driver 120.

The row driver 120 may transmit the control signals for outputting the pixel signal to the pixel array 110, and the pixel PX may output the pixel signal by operating in response to the control signals. For example, the row driver 120 may generate control signals controlling a large photodiode LPD and a small photodiode SPD to operate in a high conversion gain (HCG) mode or a low conversion gain (LCG) mode in a read-out section, and provide the generated control signals to the pixel array 110. A detailed description thereon is given below with reference to FIG. 2.

The ramp signal generator 140 may generate a ramp signal RAMP, which increases or decreases by a certain gradient, and provide the ramp signal RAMP to the ADC circuit 131 of the read-out circuit 130.

The read-out circuit 130 may read the pixel signal from the pixels PX of a row selected by the row driver 120, among the plurality of pixels PX. At this time, the pixel signal may include a reset signal or an image signal (or a sensing signal.) The read-out circuit 130 may convert reset signals and image signals received from the pixel array 110 through a plurality of column lines CL into digital signals based on the ramp signal RAMP from the ramp signal generator 140 to generate and output pixel values corresponding to the plurality of pixels PX by units of rows.

The ADC circuit 131 may include a plurality of ADCs respectively corresponding to a plurality of column lines CL, and each of the plurality of ADCs may respectively compare reset signals received through the corresponding column lines CL to the ramp signal RAMP and generate pixel values based on the comparison results. For example, the ADC may remove the reset signal from the image signal and generate a pixel value representing an amount of light sensed by the pixel PX.

A plurality of pixel values generated by the ADC circuit 131 may be output as image data IDT through the data bus 132. For example, the image data IDT may be provided to an internal or external image signal processor of the image sensor 100.

The data bus 132 may temporarily store and output the pixel values output from the ADC circuit 131. The data bus 132 may include a plurality of column memories, and a column decoder. A plurality of pixel values stored in the plurality of column memories may be output as image data IDT under the control by the column decoder.

The ADC circuit 131 may include a plurality of correlated double sampling (CDS) circuits (not shown) and a plurality of counter circuits (not shown.) The ADC circuit 131 may convert a pixel signal input from the pixel array 110 into a pixel value, which is a digital signal. Each pixel signal received through each of the plurality of column lines CL may be converted into a pixel value, which is a digital signal, by the CDS circuit and the counter circuit.

The CDS circuit may compare the pixel signal received through the column line CL to the ramp signal RAMP and output the comparison result. The CDS circuit may output a comparison signal transitioning from a first level (e.g., logic high) to a second level (e.g., logic low) when a level of the ramp signal RAMP is identical to a level of the pixel signal.

The time point of transitioning of the level of the comparison signal may be determined according to the level of the pixel signal.

The CDS circuit may sample and hold a pixel signal provided from the pixel PX according to the CDS method, and by double sampling a level of particular noise (e.g., a reset signal) and a level according to an image signal, generate a comparison signal based on a level corresponding to the difference. In some example embodiments, the CDS circuit may include one or more comparators. The comparator may be implemented as, for example, an operational transconductance amplifier (OTA) (or a differential amplifier.)

The ADC circuit 131 may include a plurality of delta reset sampling (DRS) circuits (not shown.) The DRS circuit may sample a provided pixel signal by first reading out an image signal according to a DRS method, and then a reset signal.

In some example embodiments, when an operational mode of the pixel PX is changed in the read-out section (e.g., a change from the LCG mode to the HCG mode or a change from the HCG mode to the LCG mode), the image sensor 100 may further include a bias current controller (not shown) for increasing or reducing a bias current, and a plurality of bias current controllers may be connected to each of the plurality of column lines CL. For example, an amount of bias current when the pixel PX operates in the HCG mode may be less than an amount of bias current when the pixel PX operates in the LCG mode.

The signal processor 190 may perform noise reduction, gain adjustment, waveform shaping, interpolation, white balancing, gamma processing, edge enhancement, binning, etc. on the image data. In some example embodiments, as the pixel array 110 operates in an HCG mode of a large photodiode LPD, an LCG mode of a large photodiode LPD, an HCG mode of a small photodiode SPD, and an LCG mode of a small photodiode SPD in one frame section, the signal processor 190 may receive pixel signals corresponding to the said modes from the data bus 132, and generate an image having a high dynamic range by merging the received pixel signals. In some example embodiments, the signal processor 190 may be provided in an external processor of the image sensor 100.

Figure 2:
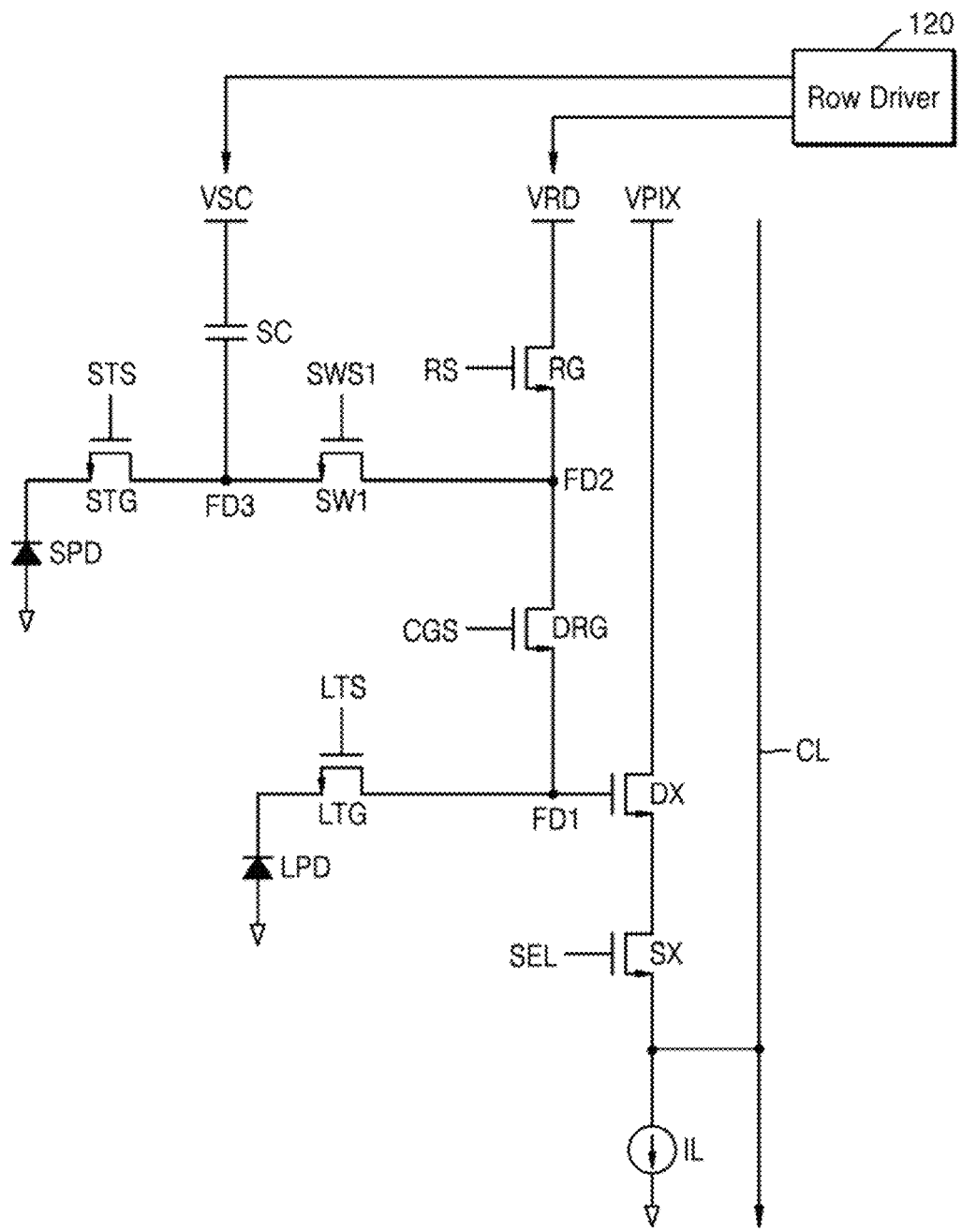
FIG. 2 is a diagram illustrating pixel rows and voltage signals of a row driver according to some example embodiments.

FIG. 2 is a diagram illustrating pixel rows and voltage signals of a row driver according to some example embodiments.

With reference to FIG. 2, the unit pixel PX may correspond to a split photodiode structure. For example, the unit pixel PX may include a large photodiode LPD and a small photodiode SPD. The unit pixel PX may include a large photodiode LPD having a relatively wide light receiving area and a small photodiode SPD having a relatively narrow light receiving area.

As the light receiving area of the large photodiode LPD is wide, more charges may be generated therefrom compared to the small photodiode SPD under the same light receiving conditions. That is, the large photodiode LPD may have a higher sensitivity than the small photodiode SPD, and generate a pixel signal corresponding to a low light level. The small photodiode SPD may generate a pixel signal corresponding to a high light level. Hereinafter, for convenience in explanation, the pixel PX is described as including the large photodiode LPD and the small photodiode SPD. However, the inventive concepts are not limited thereto, and the pixel PX may include a plurality of photodiodes having the same or different light receiving areas.

In each of the plurality of pixels PX, charges generated by a photoelectric conversion element such as a photodiode may be accumulated in a floating diffusion node, and the charges accumulated in the floating diffusion node may be converted into a voltage. At this time, a conversion ratio of charges accumulated in the floating diffusion node may be referred to as a conversion gain. The conversion gain may vary according to the capacitance of the floating diffusion node.

Specifically, when the capacitance of the floating diffusion node increases, the conversion gain may decrease, and when the capacitance of the floating diffusion node decreases, the conversion gain may increase. In some example embodiments, each of the plurality of pixels PX may operate as a dual conversion gain. The dual conversion gain may include an LCG and an HCG. The HCG may have a higher ratio of charges converted into a voltage, and thus, may be applied to an operation of generating a pixel signal corresponding to a lower light level, compared to the LCG. Hereinafter, for convenience in explanation, an operational mode in which a pixel signal is generated by using the HCG will be referred to as an HCG mode, and an operational mode in which a pixel signal is generated by using the LCG will be referred to as an LCG mode.

In some example embodiments, each of the large photodiode LPD and the small photodiode SPD may generate pixel signals in the dual conversion gain modes described above. Specifically, the large photodiode LPD may operate in the HCG mode to generate a first pixel signal corresponding to a first light level section, which is the lowest light level section, or operate in the LCG mode to generate a second pixel signal corresponding to a second light level section, which is a higher light level section than the first light level section. In addition, the small photodiode SPD may operate in the HCG mode to generate a third pixel signal corresponding to a third light level section, which is a higher light level section than the second light level section, or operate in the LCG mode to generate a fourth pixel signal corresponding to a fourth light level section, which is the highest light level section. Further, the first to fourth pixel signals may be generated in one frame section in which the pixel array 110 is scanned.

With reference to FIGS. 1 and 2, the unit pixel PX may include a plurality of photodiodes, such as the small photodiode SPD and the large photodiode LPD. The pixel PX may include a plurality of transistors, such as a first transmission transistor LTG, a second transmission transistor STG, a reset transistor RG, a driver transistor DX, a selection transistor SX, a gain control transistor DRG (or also referred to as a conversion gain control transistor), a first switch transistor SW1, and a capacitor SC. The control signals STS, LTS, RS, SEL, CGS, and SWS1 may be applied to the pixel PX, and at least some of the control signals may be generated in the row driver 120.

The large photodiode LPD and the small photodiode SPD may generate photocharges which vary according to an amount of light. For example, the large photodiode LPD and the small photodiode SPD may generate charges, i.e., electrons, which are negative charges, and positive holes, which are positive charges, in proportion to an amount of incident light. The photocharges generated by the large photodiode LPD and the small photodiode SPD may be transmitted to and accumulated in at least one of the floating diffusion nodes FD1, FD2, or FD3. A parasitic capacitor (not shown) may be formed in each of the floating diffusion nodes FD1, FD2, and FD3, or the floating diffusion nodes FD1, FD2, and FD3 may be connected to an actual capacitive component.

The pixel PX may include the first transmission transistor LTG. The first transmission transistor LTG may be connected between the large photodiode LPD and the floating diffusion node FD1. A first terminal of the first transmission transistor LTG may be connected to an output terminal of the large photodiode LPD, and a second terminal of the first transmission transistor LTG may be connected to the floating diffusion node FD1. The first transmission transistor LTG may be turned on or turned off in response to a first transmission control signal LTS received from the row driver 120, and may transmit the photocharges generated by the large photodiode LPD to the floating diffusion node FD1.

The pixel PX may include the conversion gain transistor DRG. A first terminal of the conversion gain transistor DRG may be connected to the floating diffusion node FD1, and a second terminal of the conversion gain transistor DRG may be connected to the floating diffusion node FD2. In response to a conversion gain signal CGS received from the row driver 120, the conversion gain transistor DRG may be turned on or turned off, and may connect the floating diffusion nodes FD1 and FD2 to each other. When the conversion gain transistor DRG is turned on, the floating diffusion node FD1 and the floating diffusion node FD2 are connected to each other to increase an equivalent capacitance which may lead to a reduced conversion gain. That is, when the conversion gain transistor DRG is turned on, the LCG mode may be activated. On the contrary to this, when the conversion gain transistor DRG is turned off, the HCG mode may be activated.

The pixel PX may include the second transmission transistor STG. The second transmission transistor STG may be connected between the small photodiode SPD and the floating diffusion node FD3. A first terminal of the second transmission transistor STG may be connected to an output terminal of the small photodiode SPD, and a second terminal of the second transmission transistor STG may be connected to the floating diffusion node FD3. The second transmission transistor STG may be turned on or turned off in response to a second transmission control signal STS received from the row driver 120, and may transmit the photocharges generated by the small photodiode SPD to the floating diffusion node FD3.

The pixel PX may include the first switch transistor SW1. A first terminal of the first switch transistor SW1 may be connected to the floating diffusion node FD2, and a second terminal of the first switch transistor SW1 may be connected to the floating diffusion node FD3. The first switch transistor SW1 may be turned on or turned off in response to a first switch control signal SWS1 received from the row driver 120, and connect the floating diffusion nodes FD2 and FD3 to each other.

The pixel PX may include a capacitor SC. A first terminal of the capacitor SC may be connected to the floating diffusion node FD3, and an SC voltage VSC may be applied to a second terminal of a small capacitor SC. Restated, the capacitor SC may be connected to the floating diffusion node FD3 and a voltage node (e.g., terminal) at which SC voltage VSC may be applied. When the first switch transistor SW1 is turned on, the floating diffusion nodes FD2 and FD3 are connected to each other, and the capacitor SC may be connected to a parasitic capacitor formed in the floating diffusion node FD2 in parallel. Accordingly, the capacitance of the floating diffusion node FD2 may increase. Further, according to some example embodiments, charges may overflow from the small photodiode SPD due to exposure operations, and the overflowed charges (e.g., accumulating overflowed charges of the small photodiode SPD) may be accumulated in the capacitor SC through the floating diffusion node FD3.

The pixel PX may include the reset transistor RG. The reset transistor RG may reset charges accumulated in at least one of the floating diffusion nodes FD1, FD2, or FD3. A reset voltage (e.g., an RD voltage VRD) may be applied to a first terminal of the reset transistor RG, and a second terminal of the reset transistor RG may be connected to the floating diffusion node FD2. It will be understood that, as shown in FIG. 2, the reset transistor RG may connect the floating diffusion node FD2 to a separate voltage node (e.g., terminal) to which the RD voltage VRD may be applied. However, the inventive concepts are not limited thereto, and a pixel voltage VPIX may be applied to the second terminal of what reset transistor RG. The reset transistor RG may be turned on or turned off in response to a reset control signal RS received from the row driver 120, and may reset the floating diffusion node FD2 by draining charges accumulated in the floating diffusion node FD2.

The pixel PX may include the driver transistor DX. A first terminal of the driver transistor DX may be connected to the selection transistor SX, and a driving voltage (e.g., the pixel voltage VPIX) may be applied to a second terminal of the driver transistor DX. The driver transistor DX may operate as a source follower based on a bias current IL generated by a current source CS connected to the column line CL, and output as a pixel signal a current corresponding to charges accumulated in at least one of the floating diffusion nodes FD1, FD2, or FD3.

The pixel PX may include the selection transistor SX. A first terminal of the selection transistor SX may be connected to the driver transistor DX, and a second terminal of the selection transistor SX may be connected to the column line CL. The selection transistor SX may be turned on or turned off in response to a selection signal SEL received from the row driver 120. When the selection transistor SX is turned on during a read-out operation, a reset signal corresponding to a reset operation or a pixel signal including an image signal corresponding to a charge accumulation operation may be output to the column line CL.

The large photodiode LPD may generate pixel signals corresponding to a dual conversion gain through a gain control transistor DRG. For example, when the LCG mode is activated during a read-out of the large photodiode LPD, the gain control transistor DRG may be turned on, and the floating diffusion node FD2 may be connected to the floating diffusion node FD1, which may lead to increased capacitance. As another example, when the HCG mode is activated during a read-out of the large photodiode LPD, the gain control transistor DRG may be turned off, and the floating diffusion node FD2 may not be connected to the floating diffusion node FD1, thereby maintaining the existing capacitance (e.g., parasitic capacitance) of the floating diffusion node FD1.

The small photodiode SPD may generate pixel signals corresponding to a dual conversion gain through the first switch transistor SW1. For example, when the LCG mode is activated during a read-out of the small photodiode SPD, the first switch transistor SW1 may be turned on, and the floating diffusion node FD3 may be connected to the floating diffusion node FD2, which may lead to increased capacitance. As another example, when the HCG mode is activated during a read-out of the small photodiode SPD, the first switch transistor SW1 may be turned off, and the floating diffusion node FD3 may not be connected to the floating diffusion node FD2, thereby maintaining the existing capacitance (e.g., parasitic capacitance) of the floating diffusion node FD2.

According to some example embodiments, the row driver 120 may set different voltage values of the SC voltage VSC and the RD voltage VRD for the read-out section and an exposure integration (EIT) section. According to some example embodiments, in the read-out section, the SC voltage VSC and the RD voltage VRD may have the same voltage value. For example, the SC voltage VSC and the RD voltage VRD may correspond to an internal regulator voltage VRG provided from an internal regulator of the row driver 120.

According to some example embodiments, in the EIT section, the SC voltage VSC and the RD voltage VRD may have different voltage values. For example, in the EIT section, the SC voltage VSC may correspond to a first internal voltage VIN1 different from the internal regulator voltage VRG. The first internal voltage VIN1 may have a voltage value smaller than the internal regulator voltage VRG. As the greater a voltage value of the first internal voltage VIN1 is, the greater a dark current, which is a leakage current, may become, the voltage value of the first internal voltage VIN1 may be set to a value smaller than the internal regulator voltage VRG. As another example, in the EIT section, the RD voltage VRD may correspond to the pixel voltage VPIX. When an optical input of a high light level is received in the EIT section, a reverse leakage current may be generated toward a photodiode, and as a level of current occurring in the pixel array 110 entirely may be significant, to prevent an IR drop by the leakage current, the pixel voltage VPIX provided by an external regulator may be used as the RD voltage VRD.

In other words, in the read-out section, each of the RD voltage VRD and the SC voltage VSC may be identical to the internal regulator voltage VRG; however, their terminals for connection may be different, and thus, the RD voltage VRD and the SC voltage VSC may be separated in the unit pixel PX.

In the reset section of the small photodiode SPD, while the reset transistor RG is turned on and drains charges of the floating diffusion node FD2, resistance components by metal lines may be observed from the row driver 120 to the RD voltage VRD. The resistance component may vary depending on which column in a row the unit pixel PX is arranged. For example, a resistance component observable by a unit pixel of the Nth column, which is farthest from the row driver 120, may be greater than a resistance component observable by a unit pixel of the first column, which is nearest to the row driver 120. In other words, the farther from the row driver 120 a column including a unit pixel is arranged, the more the resistance component may increase.

Further, due to the electrical connection between the row driver 120 and the unit pixel PX, a section in which a potential of the floating diffusion node FD3 is lowered according to a time constant based on a resistance component by the metal lines and the capacitor SC may be generated. At this time, as for the unit pixel of the Nth column farthest from the row driver 120, N capacitors included in one row are connected to each other in parallel, and a capacitor having a large capacity may be observed. As for the unit pixel of the Nth column closest to the row driver 120, the capacitance equivalent to one capacitor SC may be observed. The time constants corresponding to each unit pixel PX may be represented according to Equation 1 below.

$$\tau = R_{MET} * (C_{SC} * N + C_{MET}) \quad \text{[Equation 1]}$$

In Equation 1 above, $R_{MET}$ represents a resistance component due to a metal line between the unit pixel PX and the row driver 120, $C_{SC}$ represents a capacitance value of the capacitor SC, N represents a number of a column, and $C_{MET}$ represents a parasitic capacitance value between the RD voltage VRD and the SC voltage VSC.

In other words, the farther from the row driver 120 the unit pixel PX is arranged, the greater $R_{MET}$ and $C_{SC}*N$ may become, thereby increasing a time constant. Changes in the time constant according to the position of the column is described below with reference to FIG. 7A.

Figure 3:
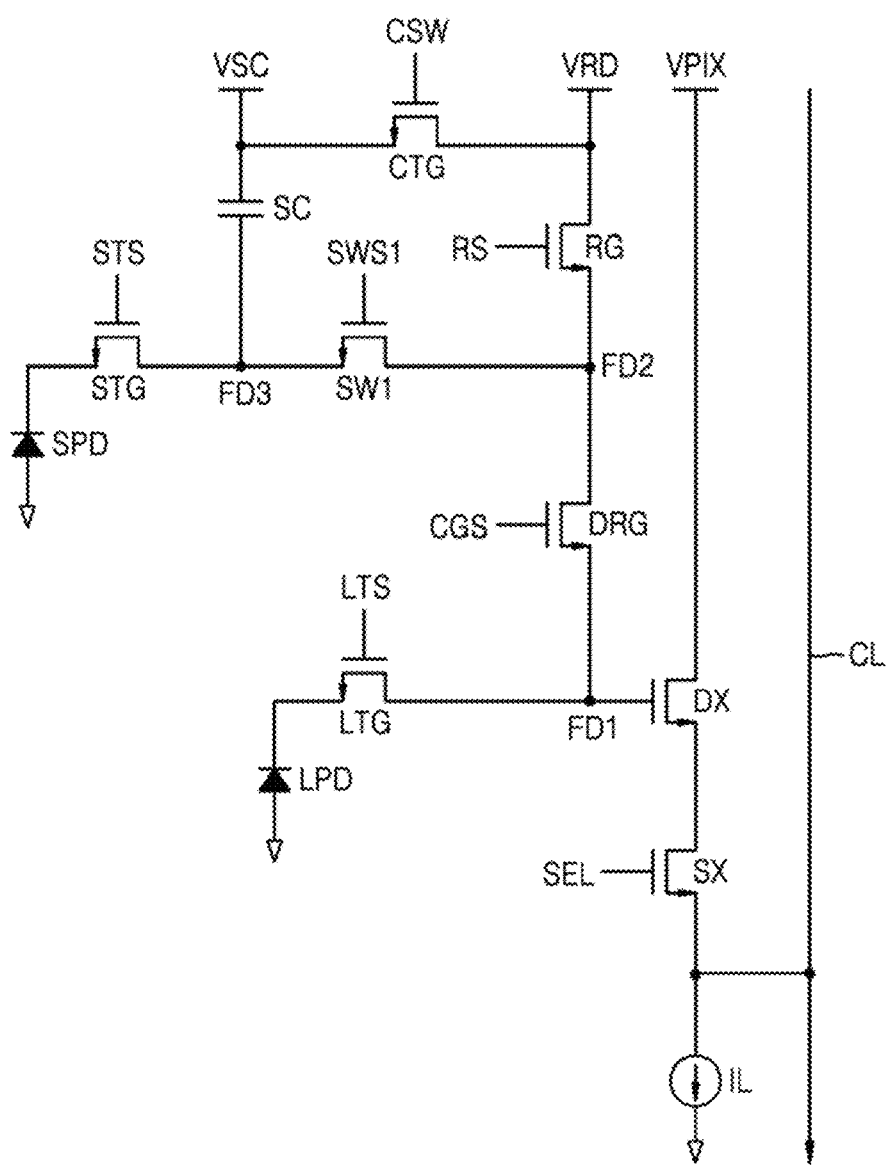
FIG. 3 is a circuit diagram illustrating an implementation example of a unit pixel according to some example embodiments.

FIG. 3 is a circuit diagram illustrating an implementation example of a unit pixel according to some example embodiments.

With reference to FIG. 3, the unit pixel PX may further include a connection switch CTG. The connection switch CTG may be implemented as a transistor and may be referred to as a second switch transistor. A first terminal of the connection switch CTG may be connected to an RD voltage VRD terminal (e.g., second voltage node), and a second terminal of the connection switch CTG may be connected to an SC voltage VSC terminal (e.g., first voltage node). Accordingly, the connection switch CTG may be a switch transistor that is connected to both the first voltage node, to which the capacitor SC is connected, and the second voltage node, to which the reset transistor RG is connected. The connection switch CTG may be turned on or turned off by receiving a connection control signal CSW from the row driver 120 through a gate terminal thereof. When the connection switch CTG is turned on, the RD voltage VRD terminal and the SC voltage VSC terminal may be electrically connected to each other.

According to some example embodiments, when the connection switch CTG is turned on, both terminals of the capacitor SC may be respectively connected to the SC voltage VSC terminal and the RD voltage VRD terminal. Accordingly, as in a section in which the SC voltage VSC and the RD voltage VRD have the same voltage value of the internal regulator voltage VRG (e.g., the read-out section), there may be no voltage difference between the both terminals of the capacitor SC, the capacitor SC may be disregarded. In addition, in a section in which the SC voltage VSC and the RD voltage VRD have the same voltage value of the internal regulator voltage VRG, a resistance component between the RD voltage VRD terminal and the row driver 120 and a resistance component between the SC voltage VSC terminal and the row driver 120 may be connected in parallel, and accordingly, an equivalent resistance value observable by the unit pixel PX may decrease significantly. That is, when the connection switch CTG is turned on, a time constant of the unit pixel PX may be represented by Equation 2 below.

$$\tau = R_{MET'} * C_{MET} \quad \text{[Equation 2]}$$

In Equation 2, $R_{MET'}$ represents an equivalent resistance component measured when a resistance component of the SC voltage VSC terminal and a resistance component of the RD voltage VRD terminal are connected in parallel.

According to some example embodiments, the row driver 120 may output the connection control signal CSW corresponding to a predefined section. For example, the connection control signal CSW may be transmitted to the unit pixel PX in correspondence with an operation section of the small photodiode SPD. According to some example embodiments, the row driver 120 may activate the connection control signal CSW in the reset section of the small photodiode SPD. By turning on the connection switch CTG in the reset section of the small photodiode SPD, the time required for a voltage level of the floating diffusion node FD3 to reach the RD voltage VRD may be reduced. Accordingly, a time constant of the unit pixel PX may be reduced and the reset time of the unit pixel PX may be reduced, thereby enabling the unit pixel PX to have improved operational performance. According to some example embodiments, the row driver 120 may activate the connection control signal CSW in the read-out section of the unit pixel PX.

Figure 4:
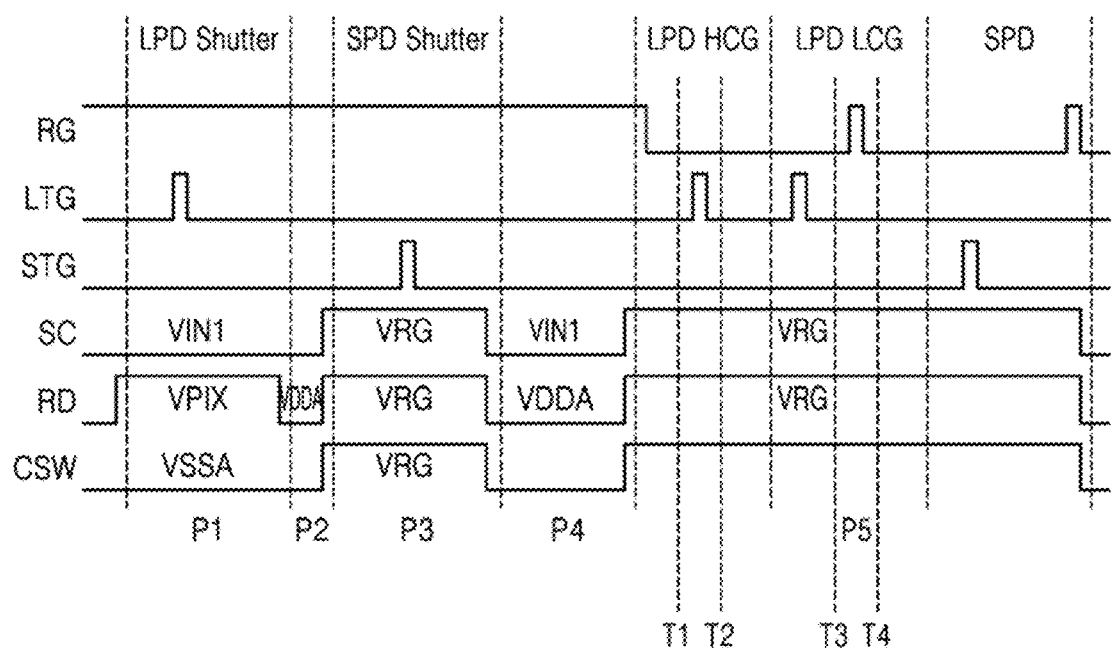
FIG. 4 is a timing diagram illustrating operations of a unit pixel according to some example embodiments.

FIG. 4 is a timing diagram illustrating operations of a unit pixel according to some example embodiments.

With reference to FIG. 4, a first section P1 may correspond to the reset section of the large photodiode LPD. During the first section P1, the reset transistor RG may be turned on in response to a logic high of the reset control signal RS. The floating diffusion node FD1 may be reset by the reset transistor RG. In the first section P1, a reset signal corresponding to a reset level of the unit pixel PX (a voltage of the floating diffusion node FD1) may be read out. In the first section P1, the RD voltage VRD may correspond to the internal regulator voltage VRG. During the first section P1, the SC voltage VSC may correspond to the first internal voltage VIN1 having a voltage value lower than the internal regulator voltage VRG. The first internal voltage VIN1 may be referred to as an EIT voltage VSC_EIT. A level of the SC voltage VSC of the first internal voltage VIN1 is lower than that of the RD voltage VRD of the internal regulator voltage VRG to reduce a dark current based on a capacitive leakage current. As the first section P1 is a reset section of the large photodiode LPD, the connection control signal CSW may be inactive.

A second section P2 may correspond to the EIT section. In the second section P2, the RD voltage VRD may be changed from the internal regulator voltage VRG to the pixel voltage VPIX. When an optical input of high light level is received in the EIT section, as a leakage current may be entirely generated in the pixel array 110, the RD voltage VRD may be changed to the pixel voltage VPIX of relatively low level. A fourth section P4 may correspond to the EIT section and descriptions on the second section P2 may be applied to the fourth section P4 as well.

A third section P3 may correspond to the reset section of the small photodiode SPD. In the third section P3, the floating diffusion node FD3 may be reset, and a reset signal corresponding to a reset level of the unit pixel PX (a voltage of the floating diffusion node FD3) may be read out. In the third section P3, the connection control signal CSW may be activated. To improve the prolonged reset time due to the capacitor SC electrically connected to the floating diffusion node FD3, the connection switch CTG may be turned on. That is, the connection control signal CSW may transition to logic high by receiving the internal regulator voltage VRG.

A fifth section P5 may correspond to the read-out section of the unit pixel PX. As described above, in the read-out section, the SC voltage VSC and the RD voltage VRD may correspond to the same voltage value. For example, the SC voltage VSC and the RD voltage VRD may correspond to the internal regulator voltage VRG. The row driver 120 may activate the connection control signal CSW to electrically connect the SC voltage VSC node to the RD voltage VRD node.

The fifth section P5 corresponding to the read-out section may be divided into a first read-out section for the large photodiode LPD and a second read-out section for the small photodiode SPD. As for the first read-out section, as the gain control signal CGS is logic low after the reset control signal RS transitions from a high level to a low level, a pixel signal output at a first time T1 may correspond to a reset signal of the HCG mode of the large photodiode LPD. After the first time T1, the transmission transistor LTG may be turned on and charges generated in the large photodiode LPD may move to and be accumulated in the floating diffusion node FD1.

At a second time T2, an image signal corresponding to the accumulated floating diffusion node FD1 may be output through the column line CL. The pixel signal output at the second time T2 may correspond to an image signal of the HCG mode of the large photodiode LPD.

According to some example embodiments, after the second time T2, the gain control transistor DRG may be turned on, and the floating diffusion node FD1 may be connected to the floating diffusion node FD2. That is, the gain control transistor DRG is turned on between the second time T2 and a third time T3, thereby causing a switch to the LCG mode, and the transmission transistor LTG is turned on, allowing the charges generated in the large photodiode LPD in the LCG mode to move to and be accumulated in the floating diffusion node FD. Accordingly, at the third time T3, an image signal of the LCG mode may be output.

At a fourth time T4, a reset signal of the LCG mode may be output. After the third time T3, the reset control signal RS may transition from a low level to a high level. Based on the reset control signal RS, the floating diffusion nodes FD1 and FD2 may be reset to the pixel voltage VPIX. Thus, a pixel signal output at the fourth time T4 may correspond to a reset signal of the LCG mode.

Figure 5A:
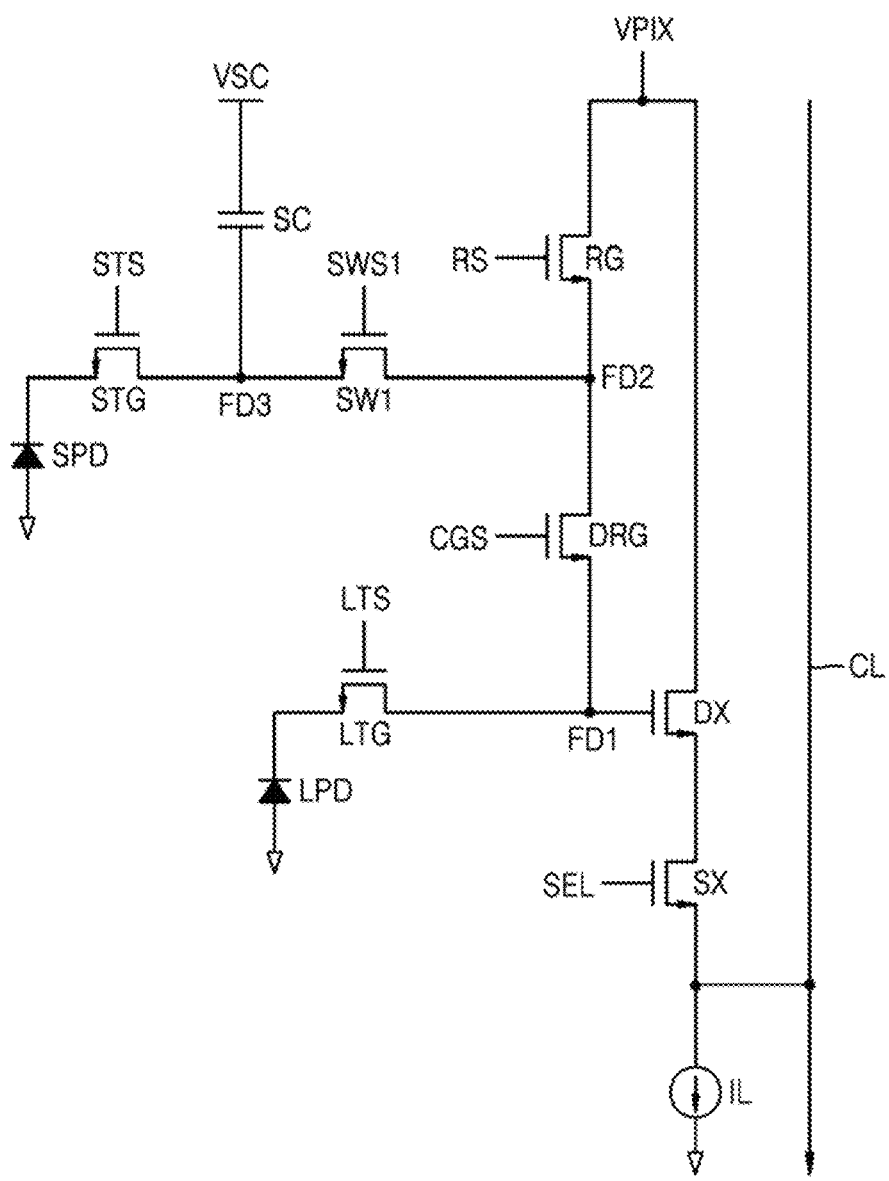
FIG. 5A is a circuit diagram illustrating an implementation example of a unit pixel according to a comparative example.
Figure 5B:
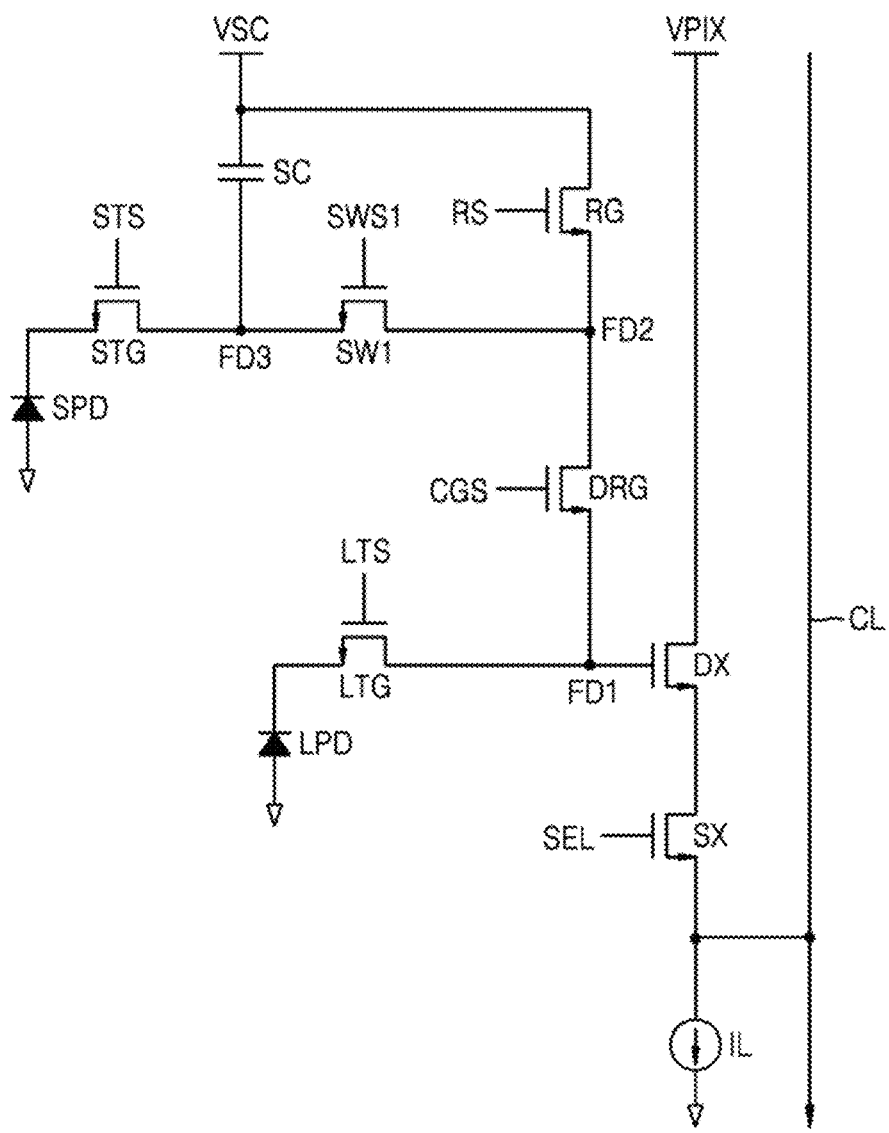
FIG. 5B is a circuit diagram illustrating another implementation example of a unit pixel according to a comparative example.

FIG. 5A is a circuit diagram illustrating an implementation example of a unit pixel according to a comparative example. FIG. 5B is a circuit diagram illustrating another implementation example of a unit pixel according to a comparative example.

With reference to FIGS. 5A and 5B, the unit pixel PX may not include the connection switch CTG. That is, one or more voltage nodes may be electrically integrated instead of controlling the connection between the voltage nodes by additionally including the connection switch CTG.

According to some example embodiments, with reference to FIG. 5A, the unit pixel PX may replace the RD voltage VRD node with the pixel voltage VPIX node. That is, a voltage applied to a drain of the reset transistor RG may correspond to the pixel voltage VPIX.

The pixel voltage VPIX input to the drain of the reset transistor RG may have a voltage level greater than that of the RD voltage VRD. When the pixel voltage VPIX having a voltage level lower than that of the RD voltage VRD is applied to the drain of the reset transistor RG in the read-out section for the unit pixel PX, the characteristic of power supply rejection ratio (PSRR) of the pixel signal may be degraded during the read-out. The degradation of the PSRR characteristic may give rise to an issue of dark shading, which refers to a phenomenon that the characteristics of a dark current appear differently to all unit pixels PX of the pixel array 110.

According to some example embodiments, with reference to FIG. 5B, the unit pixel PX may replace the RD voltage VRD node with the SC voltage VSC node. That is, a voltage applied to a drain of the reset transistor RG may correspond to the SC voltage VSC.

When the SC voltage VSC is applied to a drain of the reset transistor RG, the same SC voltage VSC is applied to both terminals of the capacitor SC and a capacitance value of the capacitor SC, which has been considered when calculating a time constant, may be removed. However, when an optical input of high light level is received, the capacitor SC for capacitance expansion may not be available. Accordingly, a leakage current may be generated toward a photodiode PD and an IR drop may occur.

Figure 6A:
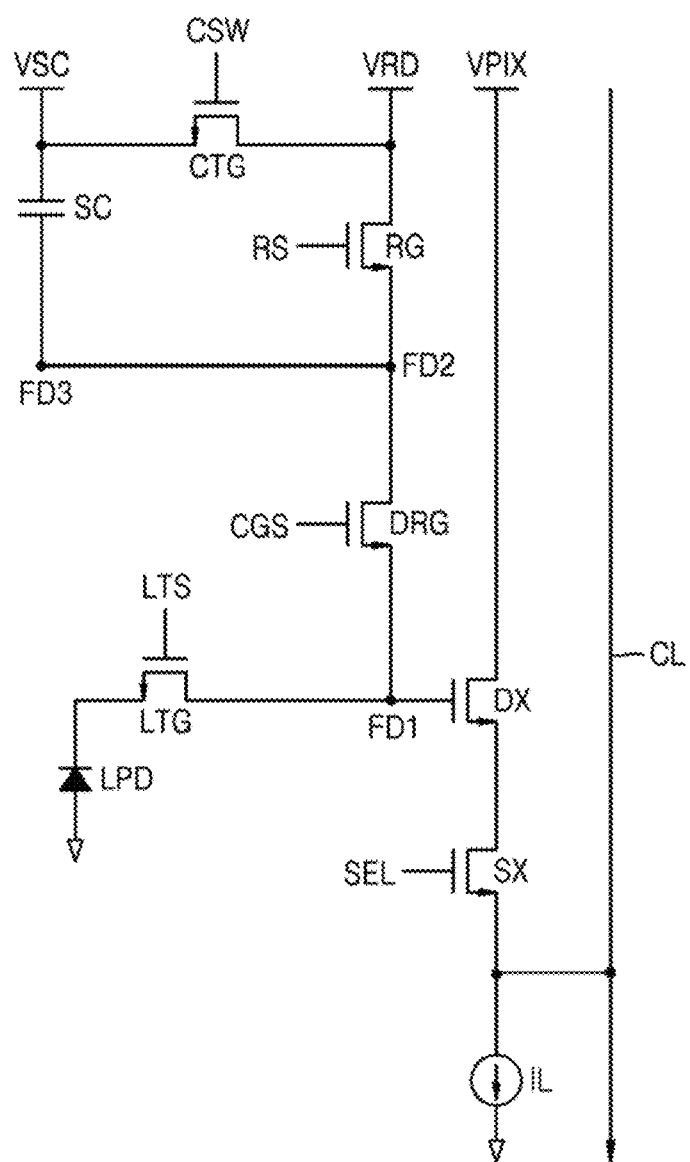
FIG. 6A is a circuit diagram illustrating an implementation example of a unit pixel according to some example embodiments.

FIG. 6A is a circuit diagram illustrating an implementation example of a unit pixel according to some example embodiments. Any description which has already been made with reference to FIG. 3 is omitted.

With reference to FIGS. 3 and 6A, the unit pixel circuit may include one photodiode PD. That is, when the transmission transistor TG is turned on, photocharges generated in the photodiode PD may move to the floating diffusion node FD1. The unit pixel circuit of FIG. 6A may operate as a dual conversion gain. That is, when the conversion gain signal CGS is logic high, the gain control transistor DRG is turned on to connect the floating diffusion node FD1 to the floating diffusion node FD2, and the low conversion mode may be activated. That is, when the conversion gain signal CGS is logic low, the gain control transistor DRG is turned off to disconnect the floating diffusion node FD1 from the floating diffusion node FD2, and the high conversion mode may be activated. In FIG. 6A, the unit pixel circuit including one photodiode PD may also receive the connection control signal CSW of logic high, and a connection transistor CTG may be turned on, thereby reducing a time constant as described with reference to FIG. 3.

Figure 6B:
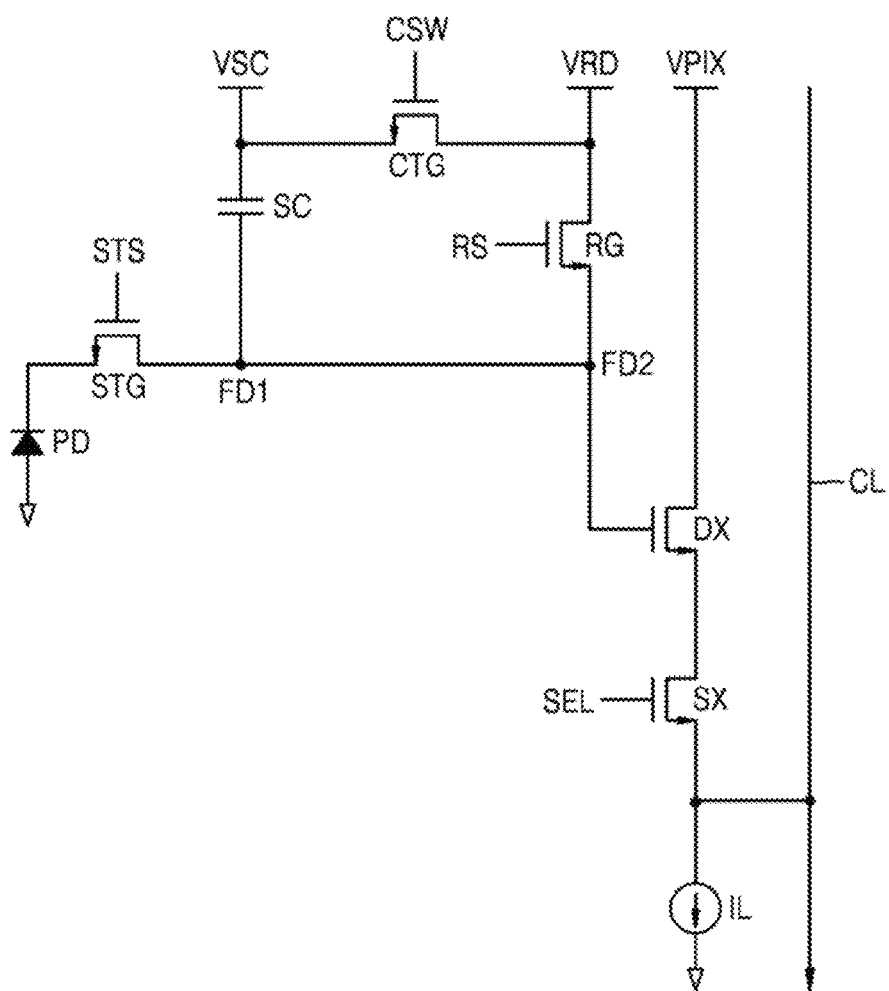
FIG. 6B is a circuit diagram illustrating an implementation example of a unit pixel according to some example embodiments.

FIG. 6B is a circuit diagram illustrating an implementation example of a unit pixel according to some example embodiments.

With reference to FIG. 6B, the unit pixel circuit may include one photodiode PD. That is, when the transmission transistor TG is turned on, photocharges generated in the photodiode PD may move to the floating diffusion node FD1. At this time, charges may overflow from the photodiode PD by an exposure operation, and the overflowed charges may be accumulated in the capacitor SC through the floating diffusion node FD1. In FIG. 6B, the unit pixel circuit including one photodiode PD may also receive the connection control signal CSW of logic high, and a connection transistor CTG may be turned on, thereby reducing a time constant as described with reference to FIG. 3.

Figure 7A:
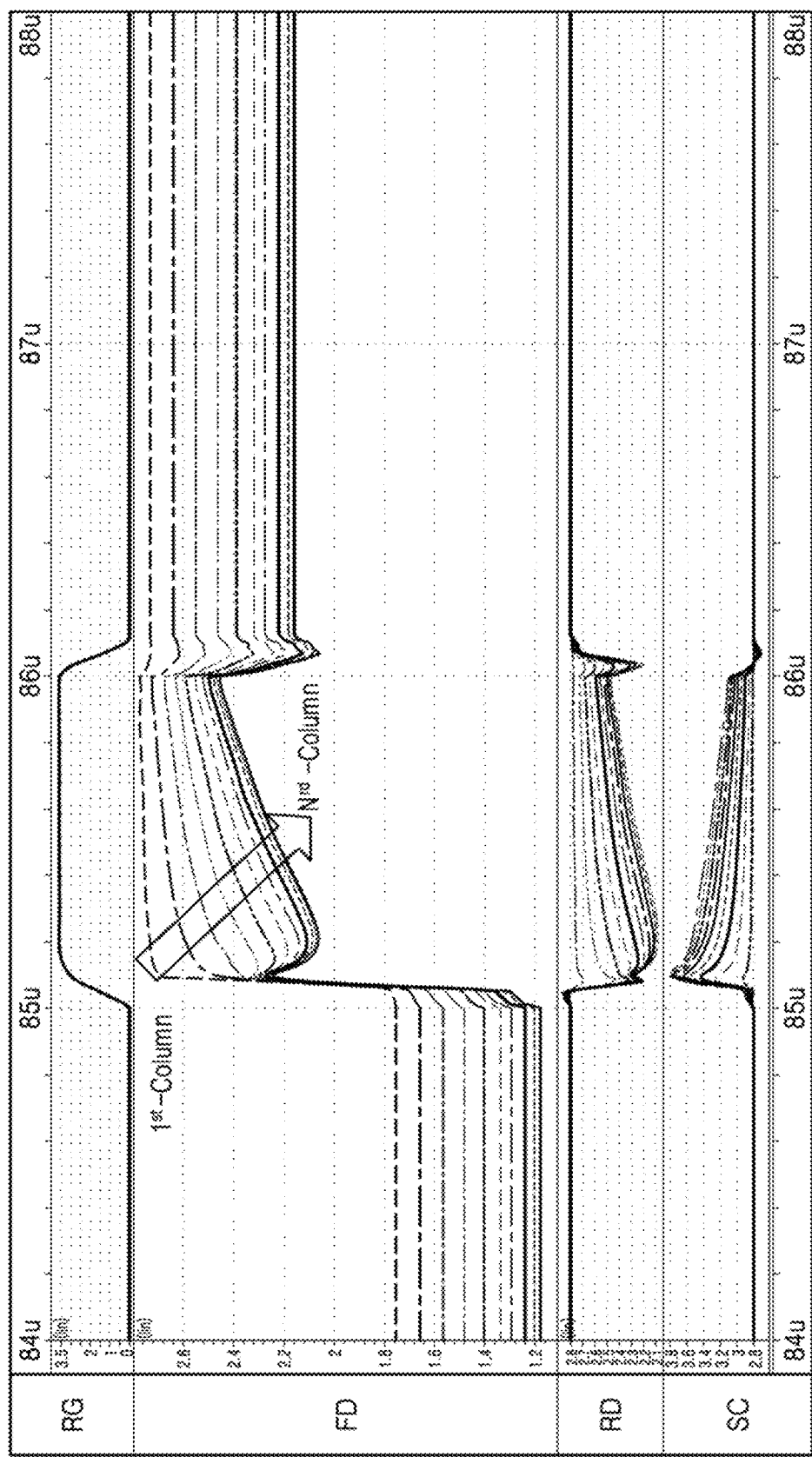
FIG. 7A is a graph showing voltage level changes of a floating diffusion node according to a comparative example.
Figure 7B:
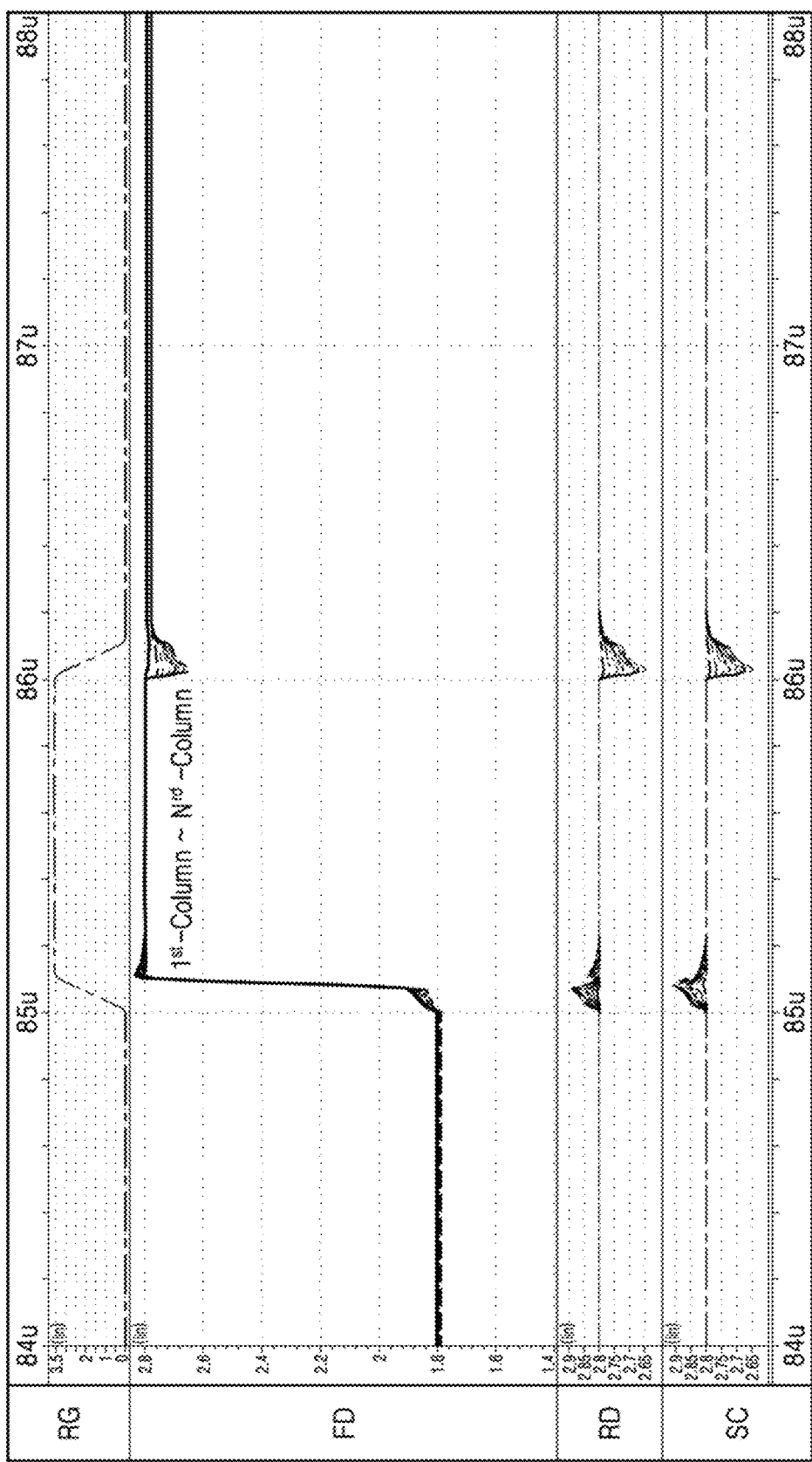
FIG. 7B is a graph showing voltage level changes of a floating diffusion node based on activation of a connection switch according to some example embodiments.

FIG. 7A is a graph showing voltage level changes of a floating diffusion node according to a comparative example, and FIG. 7B is a graph showing voltage level changes of a floating diffusion node based on activation of a connection switch according to some example embodiments.

FIG. 7A illustrates changes in a voltage level for the floating diffusion node FD3 of the unit pixel PX, which does not include the connection switch CTG.

According to some example embodiments, among the unit pixels of a particular row, the unit pixel PX arranged in the first column may hardly have a reduction section of the floating diffusion node FD3 according to a time constant. This is because N has a small value of 1 based on Equation 1. According to sweeping of the unit pixel PX from the first column to the Nth column, a voltage level reduction section of the floating diffusion node FD3 according to a time constant may become longer. That is, up to the unit pixel PX of the third column, a voltage level reduction section of the floating diffusion node FD3 may not visibly exist, and the graph may change so that time required to reach saturation increases. However, a section in which the voltage level of the floating diffusion node FD3 of the unit pixel PX reduces according to a time constant may increase as approaching the Nth column. This is because an equivalent capacitance value of C from the time constant $\tau=RC$ value increases according to increased capacitors SC in parallel as approaching the Nth column, and also because as a distance from the unit pixel PX to the row driver 120 increases, a resistance component R of metal line may also increase.

FIG. 7B illustrates changes in voltage level for the floating diffusion node FD3 of the unit pixel PX including the connection switch CTG. As described above, the connection switch CTG may be activated in the reset section of the small photodiode LPD and the read-out section of the unit pixel PX.

According to some example embodiments, the unit pixel PX may not consider the capacitor SC by electrically connecting the SC voltage VSC node to the RD voltage VRD node. Accordingly, an equivalent capacitance value of C from a time constant $\tau=RC$ may decrease to include only the parasitic capacitance between the metal lines, and a resistance component R may also decrease by formation of a parallel connection. For example, the time required for the voltage level of the floating diffusion node FD3 of the unit pixel PX of the Nth column to reach saturation is reduced significantly compared to the case of FIG. 7A. In addition, with reference to FIG. 7A, the deviation of reset time according to a time constant among the unit pixels constituting a row is significant, whereas the deviation of reset time according to a time constant among the unit pixels constituting a row is almost removed in FIG. 7B. This is because a parasitic capacitance, which is an equivalent capacitance value of C from a time constant $\tau=RC$, is relatively constant compared to a distance change of metal lines from each column to the row driver 120.

Figure 8:
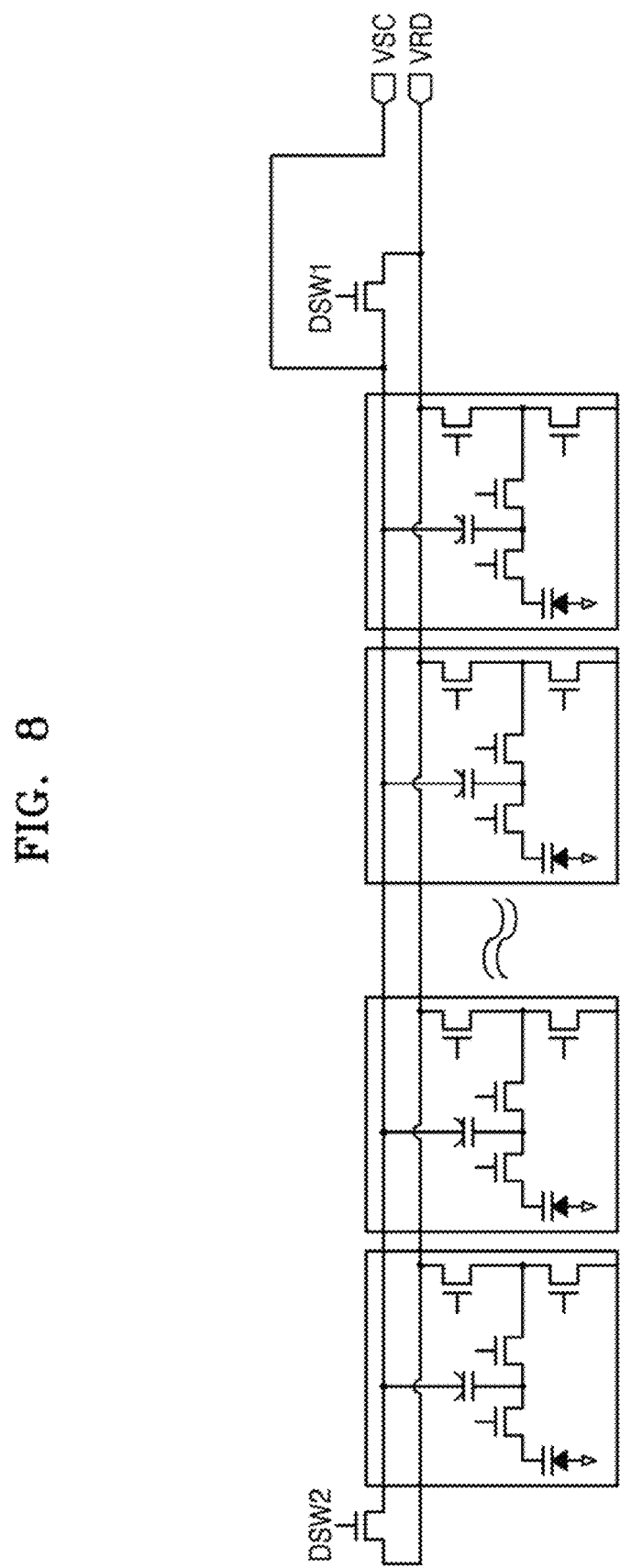
FIG. 8 is a diagram illustrating another example of a pixel array according to some example embodiments.

FIG. 8 is a diagram illustrating another example of a pixel array according to some example embodiments.

FIG. 8 illustrates a low resolution pixel array according to some example embodiments. For example, the low resolution pixel array may include N unit pixels constituting a row.

According to some example embodiments, the low resolution pixel array may include a first switch DSW1 and a second switch DSW2. Each of the first switch DSW1 and the second switch DSW2 may electrically connect the SC voltage VSC node to the RD voltage VRD node. For example, the first switch DSW1 may electrically connect the SC voltage VSC node of the first unit pixel PX most adjacent to the row driver (not shown) to the RD voltage VRD node of the first unit pixel PX. The second switch DSW2 may electrically connect the SC voltage VSC node of the Nth unit pixel PX most distanced from the row driver (not shown) to the RD voltage VRD node of the Nth unit pixel PX.

When both of the first switch DSW1 and the second switch DSW2 are turned on, the SC voltage VSC node may be electrically connected to the RD voltage VRD node of each of the pixel units included in the low resolution pixel array. Restated, an image sensor that includes the low resolution pixel array may be configured to cause the first and second voltage nodes of each unit pixel of the low resolution pixel array to be electrically connected to each other in response to the first switch DSW1 and the second switch DSW2 being turned on. According, as described above with reference to FIG. 3, the reset time may be improved based on a time constant under the condition that the capacitor SC in the unit pixel PX has been removed.

Figure 9:
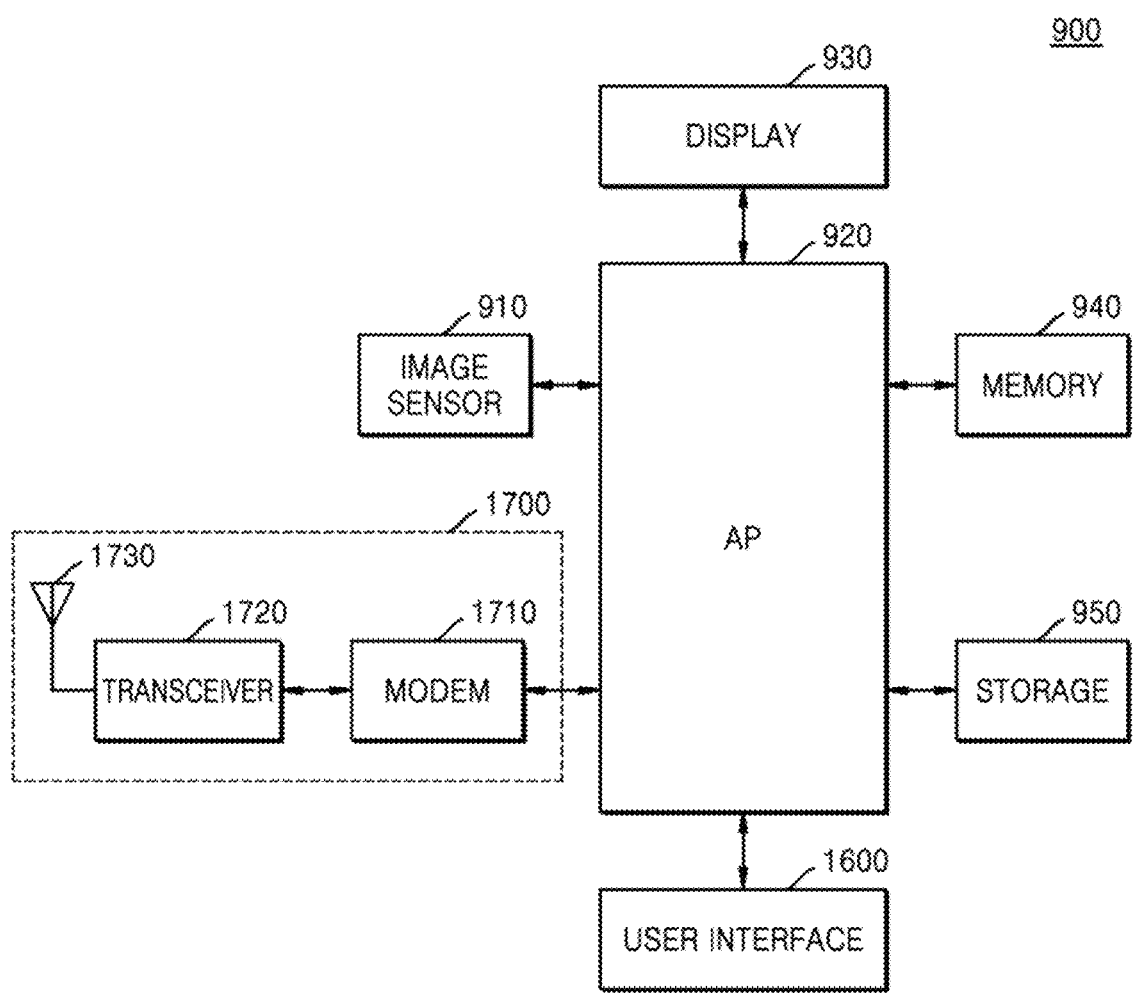
FIG. 9 is a block diagram of an electronic device according to some example embodiments.

FIG. 9 is a block diagram of an electronic device according to some example embodiments.

With reference to FIG. 9, an electronic device 900 may include an image sensor 910, an application processor 920, a display 930, a memory 940, a storage 950, a user interface 1600, and a wireless transceiver 1700. The image sensor 910 of FIG. 9 may correspond to the image sensor 100 of FIG. 1. The image sensor 910 of FIG. 9 may correspond to any of the image sensors according to any of the example embodiments. Any description which has already been made with reference to FIG. 1 is omitted.

The application processor 920 may be provided as a System-on-Chip (SoC) configured to control overall operations of the electronic device 900 and drive application programs, operating systems, etc. The application processor 920 may receive image data from the image sensor 910, and perform image processing on the received image data. In some example embodiments, the application processor 920 may store received image data and/or processed image data in the memory 940 or the storage 950.

The memory 940 may store programs and/or data processed or executed by the application processor 920. The storage 950 may be implemented as a nonvolatile memory device, such as NAND flash, a resistive memory, etc., and for example, the storage 950 may be provided as a memory card, such as a multimedia card (MMC), an embedded MMC (eMMC), a secure digital (SD) card, a micro SD card, etc. The storage 950 may store data and/or programs relating to a performing algorithm to control image processing operations, and when the image processing operations are performed, data and/or programs may be loaded to the memory 940.

The user interface 1600 may be implemented as various devices which may receive user inputs, such as a keyboard, a curtain key panel, a touch panel, a fingerprint sensor, a microphone, etc. The user interface 1600 may receive user inputs, and provide signals corresponding to the received user inputs to the application processor 920. The wireless transceiver 1700 may include a modem 1710, a transceiver 1720, and an antenna 1730.

Figure 10A:
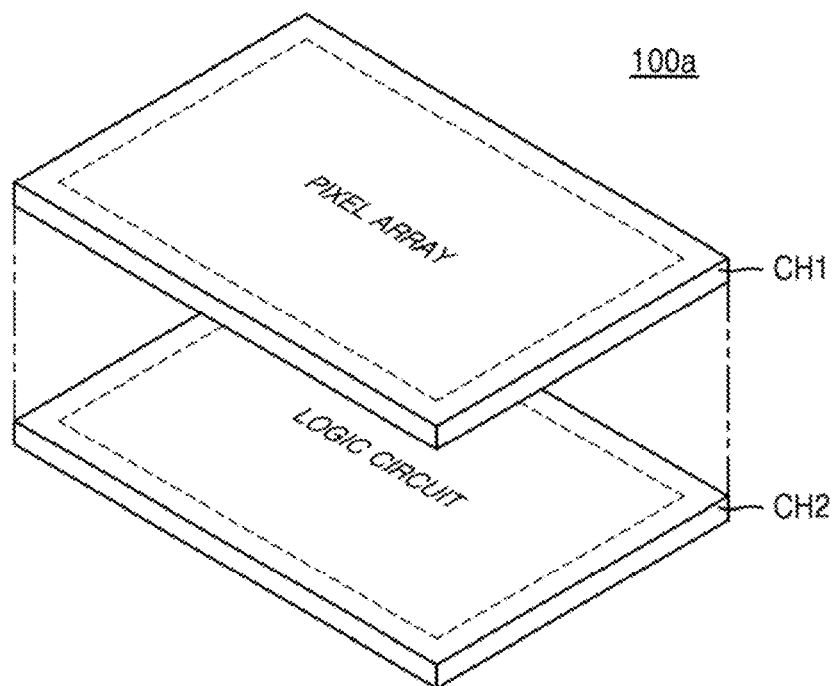
FIG. 10A is an exploded perspective view of an image sensor.
Figure 10B:
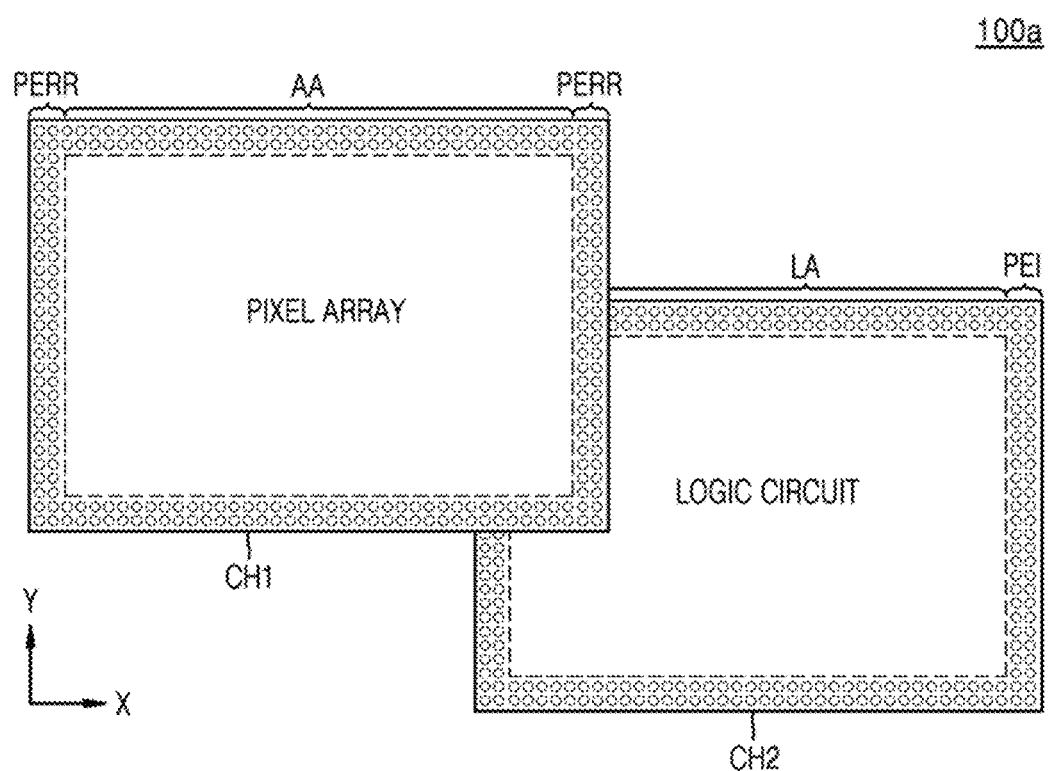
FIG. 10B is a planar view of an image sensor.
Figure 10C:
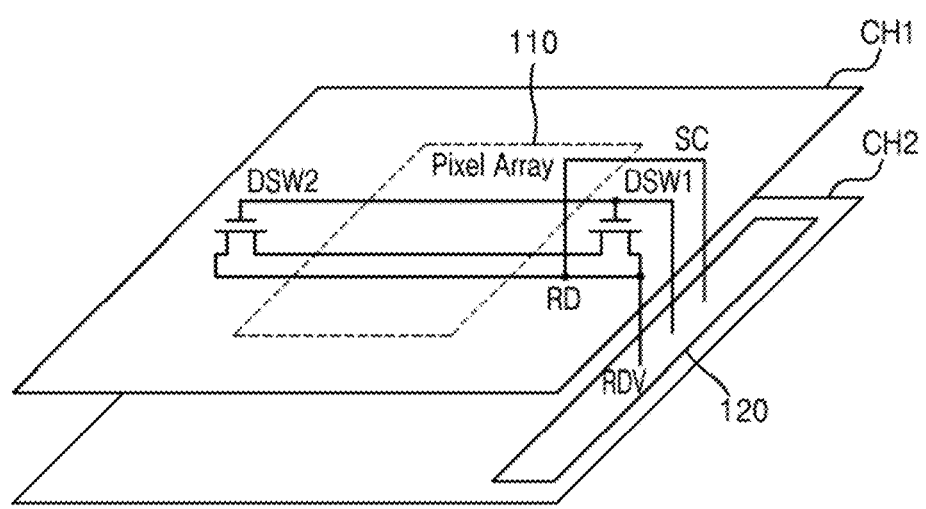
FIG. 10C is an exploded perspective view of an image sensor according to some example embodiments.

FIG. 10A is an exploded perspective view of an image sensor, FIG. 10B is a planar view of an image sensor, and FIG. 10C is an exploded perspective view of an image sensor according to some example embodiments.

With reference to FIGS. 10A and 10B, an image sensor 100a may have a structure in which a first chip CH1 and a second chip CH2 are stacked. Pixel cores (e.g., at least one photoelectric conversion element PE and pixel circuit PXC) of each of the plurality of pixels PX included in the pixel array (110 of FIG. 1) may be formed in the first chip CH1, and the logic circuits, for example, the row driver 120, the read-out circuit 130, the ramp signal generator 140, and the timing controller 150, may be formed in the second chip CH2.

As illustrated in FIG. 10B, the first chip CH1 and the second chip CH2 may respectively include an active area AA and a logic area LA arranged in a central area, and further a peripheral region PERR and PEI arranged at the outer edge of the chip. In the pixel array of the first chip CH1, the photoelectric conversion element PE and the pixel circuits PXC may be arranged in a 2D array structure. In the logic area LA of the second chip CH2, the logic circuit may be arranged.

In the peripheral region PERR and PEI of the first chip CH1 and the second chip CH2, through vias TV extending in a third direction (the Z direction) may be arranged. The first chip CH1 and the second chip CH2 may be electrically connected to each other through the through vias TV. In the peripheral region PERR of the first chip CH1, wirings and vertical contacts extending in the first direction (the X direction) or the second direction (the Y direction) may be further formed. In the wiring layer of the second chip CH2, a plurality of wiring lines extending in the first direction (the X direction) and the second direction (the Y direction) may be arranged and such wiring lines may be connected to the logic circuit. Although the first chip CH1 and the second chip CH2 are described as being electrically connected through the through vias TV, the inventive concepts are not limited thereto, and the first chip CH1 and the second chip CH2 may be implemented in various combination structures, for example, a Cu—Cu bonding, a combination structure of a through via and a Cu pad, a combination structure of a through via and an external connection terminal, a combination structure by an integrated through via, etc.

With reference to FIG. 10C, the plurality of unit pixels PX included in the pixel array 110 may be embedded in an upper chip. For example, the upper chip may correspond to the first chip CH1 of FIG. 10A. The row driver 120 may be embedded in a lower chip. For example, the lower chip may correspond to the second chip CH2 of FIG. 10A. According to some example embodiments, at least one control signal may be transmitted through the through vias TV. For example, the control signal to turn on the first switch DSW1 may be electrically transmitted through the through via TV from the lower second chip CH2 to the upper first chip CH1.

Figure 11:
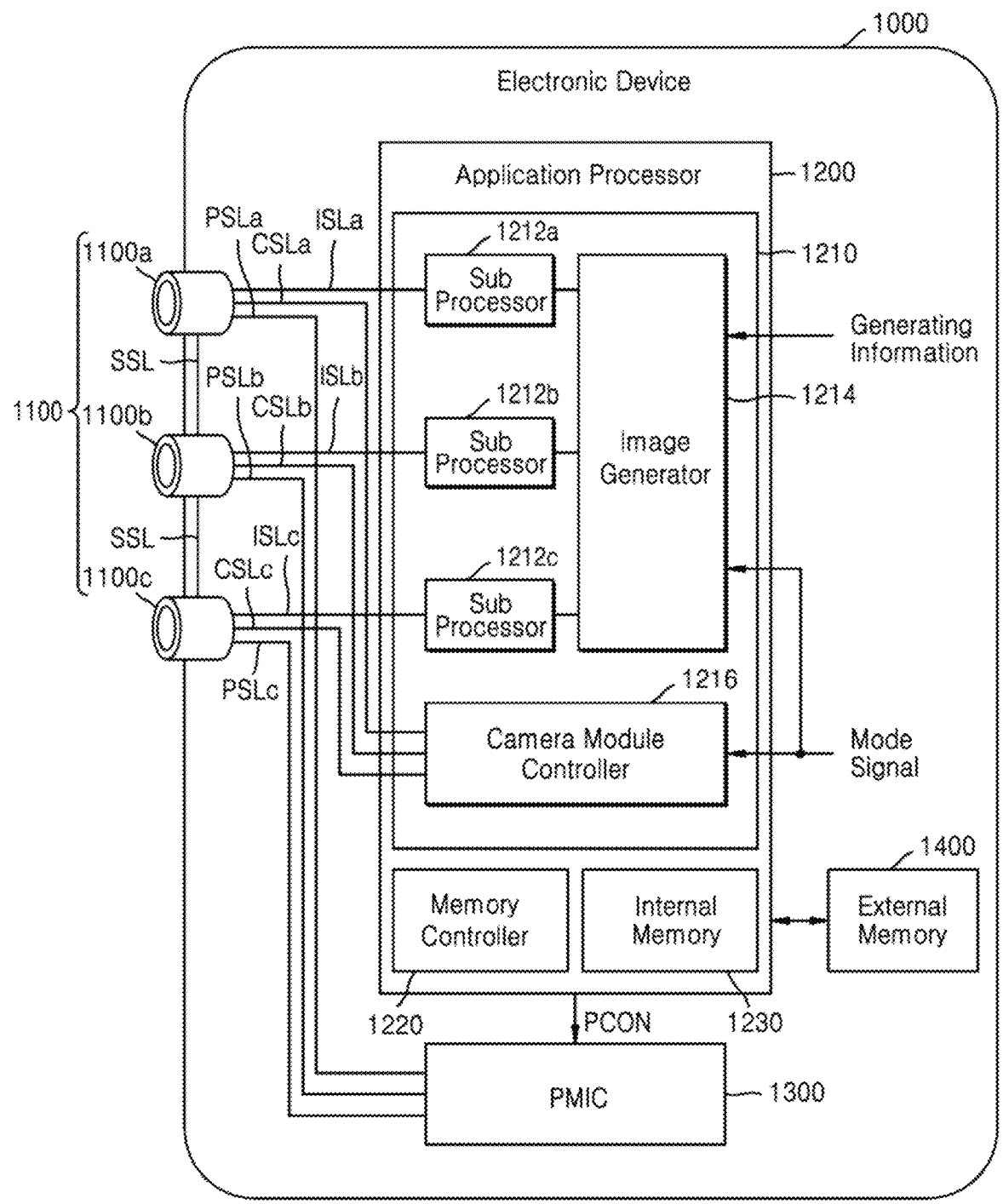
FIG. 11 is a block diagram of an electronic device including a multi-camera module according to some example embodiments.
Figure 12:
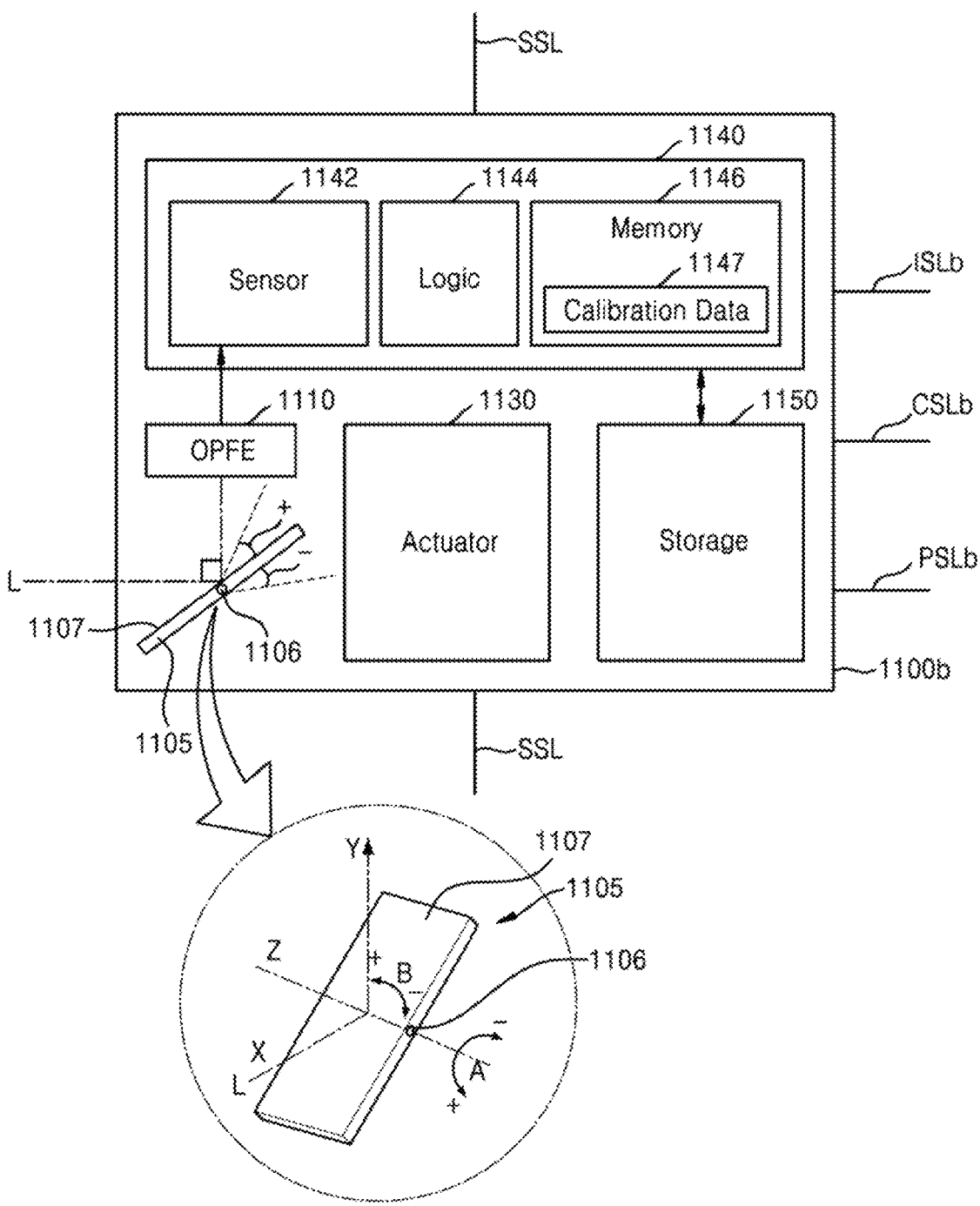
FIG. 12 is a detailed block diagram of the camera module of FIG. 11 according to some example embodiments.

FIG. 11 is a block diagram of an electronic device including a multi-camera module (also referred to herein interchangeably as a multi-camera device) according to some example embodiments. FIG. 12 is a detailed block diagram of the camera module of FIG. 11 according to some example embodiments.

In some example embodiments, the electronic device 1000 of FIG. 11 is the electronic device 900 of FIG. 9, such that application processor 1200 is the application processor 920, an image sensor 1142 in camera module group 1100 is the image sensor 910, external memory 1400 is memory 940, and storage 1500 is storage 950, and where the electronic device 1000 of FIG. 11 may include display 930, user interface 1600 and/or wireless transceiver 1700. With reference to FIG. 11, the electronic device 1000 may include a camera module group 1100, an application processor 1200, a PMIC 1300, and an external memory 1400.

The camera module group 1100 may include a plurality of camera modules 1100a, 1100b, and 1100c. As used herein, a camera module may be interchangeably referred to as a "camera," a "camera device," or the like. Although some example embodiments, including the example embodiments shown in FIG. 11, include a camera module group 1100 in which three camera modules 1100a, 1100b, and 1100c are arranged, the example embodiments are not limited thereto. In some example embodiments, the camera module group 1100 may be modified and include only two camera modules. Also, in some example embodiments, the camera module group 1100 may be modified and include k camera modules (k is a natural number greater than or equal to 4.)

Hereinafter, the detailed configuration of camera module 1100b is further described with reference to FIG. 11, and the descriptions may be applied to the other camera modules 1100a and 1100b as well according to embodiments.

With reference to FIG. 11, the camera module 1100b may include a prism 1105, an optical path folding element (OPFE) 1110, an actuator 1130, an image sensing device 1140, and a storage 1150.

The prism 1105 may include a reflector 1107 made of light reflective materials, and change the direction of light L incident from outside.

In some example embodiments, the prism 1105 may change the direction of the light L incident in the first direction (the X direction) to the second direction (the Y direction) perpendicular to the first direction (the X direction.) Further, the prism 1105 may rotate the reflector 1107 made of light reflective materials around a central axis 1106 in an A direction or rotate the central axis 1106 in a B direction to change the direction of the light L incident in the first direction (the X direction) to the second direction (the Y direction) perpendicular to the first direction. At this time, the OPFE 1110 may also move in the third direction (the Z direction) perpendicular to the first direction (the X direction) and the second direction (the Y direction).

In some example embodiments, as illustrated in the drawings, the maximum rotation angle of the prism 1105 in the A direction may be less than or equal to 15 degrees in +A direction, and greater than 15 degrees in −A direction; however, the example embodiments are not limited thereto.

In some example embodiments, the prism 1105 may move within 20 degrees in + or −B direction, or within 10 degrees to 20 degrees, or within 15 degrees to 20 degrees, and the movement may be made by the same angle in +B direction and in −B direction, or a similar angle, i.e., within an angle difference of 1 degree.

In some example embodiments, the prism 1105 may move the reflector 1107 including light reflective materials in the third direction (e.g., the Z direction) parallel to the extending direction of the central axis 1106.

The OPFE 1110 may include an optical lens consisting of, for example, m groups (m is a natural number.) The m lens may change an optical zoom ratio of the camera module 1100*b* by moving in the second direction (the Y direction.) For example, when the initial optical zoom ratio of the camera module 1100*b* is Z, and m optical lens included in the OPFE 1110 are moved, the optical zoom ratio of the camera module 1100*b* may be changed to 3Z, 5Z, or greater than 5Z.

The actuator 1130 may move the OPFE 1110 or the optical lens to a particular position. For example, the actuator 1130 may adjust the position of the optical lens so that the image sensor 1142 may be arranged at a focal length of the optical lens for accurate sensing.

The image sensing device 1140 may include an image sensor 1142, a control logic 1144, and a memory 1146. The image sensor 1142 may be any of the image sensors according to any of the example embodiments. The image sensor 1142 may sense an image of an object by using light L provided through the optical lens. The image sensor 1142 may generate image data having a high operating range by merging HCG image data and LCG image data.

The control logic 1144 may control overall operations of the camera module 1100*b*. For example, the control logic 1144 may control operations of the camera module 1100*b* according to control signals provided through a control signal line CSLb.

The memory 1146 may store data required for operations of the camera module 1100*b*, such as calibration data 1147. The calibration data 1147 may include information necessary for the camera module 1100*b* to generate image data by using light L provided from the outside. The calibration data 1147 may include, for example, information regarding degree of rotation, information regarding focal length, information regarding optical axis, etc. as described above. When the camera module 1100*b* is implemented in the form of multi state camera in which a focal length varies according to a position of an optical lens, the calibration data 1147 may include information regarding a focal length according to a position (or a state) of the optical lens, and auto focusing.

The storage 1150 may store image data sensed through the image sensor 1142. The storage 1150 may be arranged outside of the image sensing device 1140, and may be implemented in a structure in which the storage 1150 and a sensor chip constituting the image sensing device 1140 are stacked. In some example embodiments, the storage 1150 may be implemented as an electrically erasable programmable read-only memory (EEPROM), but the example embodiments are not limited thereto.

With reference to FIGS. 11 and 12, in some example embodiments, each of the plurality of camera modules 1100*a*, 1100*b*, and 1100*c* may include the actuator 1130. Accordingly, each of the plurality of camera modules 1100*a*, 1100*b*, and 1100*c* may include the same or similar calibration data 1147 according to an operation of the actuator included therein.

In some example embodiments, one camera module (e.g., 1100*b*) of the plurality of camera modules 1100*a*, 1100*b*, and 1100*c* may be a folded lens camera module including the prism 1105 and the OPFE 1110 described above, and the rest of the camera modules (e.g., 1100*a* and 1100*b*) may be a vertical camera module which does not include the prism 1105 and the OPFE 1110. However, the example embodiments are not limited thereto.

In some example embodiments, one camera module (e.g., 1100*c*) of the plurality of camera modules 1100*a*, 1100*b*, and 1100*c* may be, for example, a vertical depth camera extracting depth information by using infrared ray (IR). In such a case, the application processor 1200 may generate a 3D depth image by merging image data provided from the depth camera and image data provided from other camera module (e.g., 1100*a* or 1100*b*.)

In some example embodiments, at least two camera modules (e.g., 1100*a* and 1100*b*) of the plurality of camera modules 1100*a*, 1100*b*, and 1100*c* may have different fields of view. In some example embodiments, for example, at least two camera modules (e.g., 1100*a* and 1100*b*) of the plurality of camera modules 1100*a*, 1100*b*, and 1100*c* may have different optical lens, but the inventive concepts are not limited thereto.

Further, in some example embodiments, a field of view of each of the plurality of camera modules 1100*a*, 1100*b*, and 1100*c* may be different. In some example embodiments, an optical lens included in each of the plurality of camera modules 1100*a*, 1100*b*, and 1100*c* may also be different, but the inventive concepts are not limited thereto.

In some example embodiments, each of the plurality of camera modules 1100*a*, 1100*b*, and 1100*c* may be physically separated. That is, a sensing area of one image sensor 1142 is not divided to be used by the plurality of camera modules 1100*a*, 1100*b*, and 1100*c*, but an independent image sensor 1142 may be arranged in each of the plurality of camera modules 1100*a*, 1100*b*, and 1100*c*.

With reference to FIG. 11, the application processor 1200 may include an image processing device 1210, a memory controller 1220, and an internal memory 1230. The application processor 1200 may be implemented separately from the plurality of camera modules 1100*a*, 1100*b*, and 1100*c*. For example, the application processor 1200 and the plurality of camera modules 1100*a*, 1100*b*, and 1100*c* may be implemented in separate semiconductor chips.

The image processing device 1210 may include sub-image processors 1212*a*, 1212*b*, and 1212*c*, an image generator 1214, and a camera module controller 1216.

The image processing device 1210 may include the plurality of sub-image processors 1212*a*, 1212*b*, and 1212*c* which respectively corresponding to the plurality of camera modules 1100*a*, 1100*b*, and 1100*c*.

Image data generated from each of the camera modules 1100*a*, 1100*b*, and 1100*c* may be provided to a corresponding sub-image processor 1212*a*, 1212*b*, and 1212*c* through image signal lines ISLa, ISLb, and ISLc separated from each other. For example, the image data generated from the camera module 1100*a* may be provided to the sub-image processor 1212a through the image signal line ISLa, the image data generated from the camera module 1100b may be provided to the sub-image processor 1212b through the image signal line ISLb, and the image data generated from the camera module 1100c may be provided to the sub-image processor 1212c through the image signal line ISLc. Such image data transmission may be performed by, for example, a camera serial interface (CSI) based on a mobile industry processor interface (MPI), but the example embodiments are not limited thereto.

Meanwhile, in some example embodiments, one sub-image processor may be arranged in correspondence with a plurality of camera modules. For example, instead of the sub-image processor 1212a and the sub-image processor 1212c being implemented separately as illustrated in the drawings, they may be implemented as one integrated sub-image processor, and image data provided from the camera module 1100a and the camera module 1100c may be selected by a selection element, etc. (e.g., a multiplexer) to be provided to the integrated sub-image processor.

The image data provided to each of the sub-image processor 1212a, 1212b, and 1212c may be provided to the image generator 1214. The image generator 1214 may generate an output image by using image data provided from each of the sub-image processor 1212a, 1212b, and 1212c according to image generating information or a mode signal.

Specifically, the image generator 1214 may generate an output image by merging at least some of image data generated from the camera modules 1100a, 1100b, and 1100c having different fields of view according to image generating information or a mode signal. Also, the image generator 1214 may generate an output image by selecting any one piece of image data generated from the camera modules 1100a, 1100b, and 1100c having different fields of view according to image generating information or a mode signal.

In some example embodiments, the image generating information may include a zoom signal or a zoom factor. Also, in some example embodiments, the mode signal may be, for example, a signal based on a mode selected by a user.

When the image generating information is a zoom signal (or a zoom factor), and each of the camera modules 1100a, 1100b, and 1100c have different fields of view, the image generator 1214 may perform different operations according to a type of the zoom signal. For example, when the zoom signal is a first signal, the image generator 1214 may generate an output image by merging image data output from the camera module 1100a and image data output from the camera module 1100c, and then using the merged image signal and image data output from the camera module 1100b, which has not been used for data merging. When the zoom signal is a second signal, which is different from the first signal, the image generator 1214 may not perform such image data merging, and generate an output image by selecting any one piece of image data output from each of the camera modules 1100a, 1100b, and 1100c. However, the example embodiments are not limited thereto, and the method of processing image data may be modified in various ways, if necessary.

In some example embodiments, the image generator 1214 may receive multiple pieces of image data having different exposure time from at least one of the plurality of sub-image processors 1212a, 1212b, or 1212c, and perform a high dynamic range (HDR) processing on the multiple pieces of image data to generate a merged image data having an increased dynamic range.

The camera module controller 1216 may provide a control signal to each of the camera modules 1100a, 1100b, and 1100c. The control signal generated from the camera module controller 1216 may be provided to the corresponding camera module 1100a, 1100b, and 1100c through the control signal lines CSLa, CSLb, and CSLc separated from each other.

At least one of the plurality of camera modules 1100a, 1100b, or 1100c may be designated as a master camera (e.g., 1100b) according to the image generating information or the mode signal including the zoom signal, and the rest of the camera modules (e.g., 1100a and 1100c) may be designated as slave cameras. Such information may be included in the control signal and be provided to the corresponding camera module 1100a, 1100b, and 1100c through the control signal lines CSLa, CSLb, and CSLc separated from each other.

According to a zoom factor or an operational mode signal, a camera module operating as a master camera or a slave camera may be changed. For example, when the field of view of the camera module 1100a is wider than that of the camera module 1100b, and the zoom factor has a low zoom ratio, the camera module 1100b may operate as a master, and the camera module 1100a may operate a slave. On the contrary, when the zoom factor has a high zoom ratio, the camera module 1100a may operate as a master, and the camera module 1100b may operate as a slave.

In some example embodiments, the control signal provided to each of the camera modules 1100a, 1100b, and 1100c from the camera module controller 1216 may include a sync enable signal. For example, when the camera module 1100b is a master camera, and the camera modules 1100a and 1100c are slave cameras, the camera module controller 1216 may transmit the sync enable signal to the camera module 1100b. The camera module 1100b provided with such sync enable signal may generate a sync signal based on the provided sync enable signal, and provide the generated sync signal to the camera modules 1100a and 1100c through a sync signal line SSL. The camera module 1100b and the camera modules 1100a and 1100c may be synchronized with the sync signal and transmit image data to the application processor 1200.

In some example embodiments, the control signal provided to the plurality of camera modules 1100a, 1100b, and 1100c from the camera module controller 1216 may include mode information according to the mode signal. Based on the mode information, the plurality of camera modules 1100a, 1100b, and 1100c may operate in a first operational mode and a second operational mode with respect to a sensing speed.

The plurality of camera modules 1100a, 1100b, and 1100c may generate an image signal at a first speed in the first operational mode (e.g., generate an image signal of a first frame rate), encode the image signal at a second speed which is higher than the first speed (e.g., encode an image signal of a second frame rate higher than the first frame rate), and transmit the encoded image signal to the application processor 1200. At this time, the second speed may be 30 times less than the first speed.

The application processor 1200 may store the received image signal, i.e., the encoded image signal in the internal memory 1230 or the external memory 1400 outside the application processor 1200, read out from the internal memory 1230 or the external memory 1400 the encoded image signal for decoding, and display image data generated based on the decoded image signal. For example, a corresponding sub-processor of the plurality of sub-image processors 1212a, 1212b, and 1212c of the image processing device 1210 may perform the decoding, and the image processing on the decoded image signal.

The plurality of camera modules 1100a, 1100b, and 1100c may generate an image signal at a third speed which is lower than the first speed in the second operational mode (e.g., generate an image signal of a third frame rate lower than the first frame rate) and transmit the image signal to the application processor 1200. The image signal provided to the application processor 1200 may be a signal which has not been encoded. The application processor 1200 may perform the image processing on the received image signal or store the image signal in the internal memory 1230 or the external memory 1400.

The PMIC 1300 may provide power, for example, a power voltage to each of the plurality of camera modules 1100a, 1100b, and 1100c. For example, the PMIC 1300 may provide, under the control by the application processor 1200, a first power to the camera module 1100a through a power signal line PSLa, a second power to the camera module 1100b through a power signal line PSLb, and a third power to the camera module 1100c through a power signal line PSLc.

The PMIC 1300 may generate power corresponding to each of the plurality of camera modules 1100a, 1100b, and 1100c in response to a power control signal PCON from the application processor 1200 and adjust a level of power. The power control signal PCON may include a power adjustment signal for each operational mode of the plurality of camera modules 1100a, 1100b, and 1100c. For example, the operational mode may include a low power mode, and in such a case, the power control signal PCON may include information regarding camera modules operating in the low power mode and a set power level. The level of power provided to each of the plurality of camera modules 1100a, 1100b, and 1100c may be identical or different. Also, the power level may be changed dynamically.

As described herein, any devices, electronic devices, modules, units, and/or portions thereof according to any of the example embodiments, and/or any portions thereof (including, without limitation, the image sensor 100, row driver 120, read-out circuit 130, ramp signal generator 140, timing controller 150, signal processor 190, electronic device 900, image sensor 910, application processor 920, display 930, memory 940, storage 950, user interface 1600, wireless transceiver 1700, image sensor 100a, electronic device 1000, application processor 1200, image generator 1214, sub-image processors 1212a, 1212b, 1212c, camera module controller 1216, memory controller 1220, PMIC 1300, external memory 1400, internal memory 1230, image sensing device 1140, control logic 1144, image sensor 1142, storage 1150, OPFE 1110, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, units, and/or portions thereof according to any of the example embodiments.

Any of the memories described herein, including, without limitation, storage 950, internal memory 1230, external memory 1400, memory 1146, and/or storage 1150 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM).

While the inventive concepts have been particularly shown and described with reference to some example embodiments thereof, it will be understood that various changes in form and details may be made therein without departing from the spirit and scope of the following claims.

What is claimed is:

1. A unit pixel circuit, comprising:
a first photodiode;
a second photodiode different from the first photodiode;
a first floating diffusion node configured to accumulate charges generated in the first photodiode;
a second floating diffusion node configured to accumulate charges generated in the second photodiode;
a capacitor connected to the first floating diffusion node and configured to receive a first voltage from a first voltage node;
a first switch transistor connecting the first floating diffusion node to a third floating diffusion node;
a reset transistor connected the third floating diffusion node and configured to receive a second voltage from a second voltage node, the second voltage being different from the first voltage;
a gain control transistor connecting the second floating diffusion node to the third floating diffusion node; and
a drive transistor connected to the second floating diffusion node and configured to receive a third voltage from a third voltage node, the third voltage being different from the first and second voltages.

2. The unit pixel circuit of claim 1, further comprising a transmission transistor connected to the first photodiode and the first floating diffusion node.

3. The unit pixel circuit of claim 2, further comprising a second switch transistor connected to both the first voltage node and the second voltage node.

4. The unit pixel circuit of claim 3, wherein the second photodiode has a relatively wide light receiving area than the first photodiode.

5. The unit pixel circuit of claim 4, wherein the second switch transistor is configured to be turned on in a reset section for the first floating diffusion node, and connect the first voltage node to the second voltage node.

6. The unit pixel circuit of claim 4, wherein the second switch transistor is configured to be turned on in a read-out section for at least one of the second floating diffusion node or the third floating diffusion node, and connect the first voltage node to the second voltage node.

7. An image sensor, comprising:
a pixel array in which a plurality of pixels implemented in a first chip are arranged; and a logic circuit implemented in a second chip forming a stacked structure with the first chip, wherein each of the plurality of pixels includes
- a first photodiode;
- a second photodiode different from the first photodiode;
- a first floating diffusion node configured to accumulate charges generated in the first photodiode;
- a second floating diffusion node configured to accumulate charges generated in the second photodiode;
- a capacitor connected to the first floating diffusion node and configured to receive a first voltage from a first voltage node;
- a first switch transistor connecting the first floating diffusion node to a third floating diffusion node;
- a reset transistor connected the third floating diffusion node to and configured to receive a second voltage from a second voltage node, the second voltage being different from the first voltage;
- a gain control transistor connecting the second floating diffusion node to the third floating diffusion node; and
- a drive transistor connected to the second floating diffusion node and configured to receive a third voltage from a third voltage node, the third voltage being different from the first and second voltages, wherein the logic circuit is configured to transmit control signals to the pixel array of the first chip.

8. The image sensor of claim 7, further comprising a first transmission transistor connected to the first photodiode and the first floating diffusion node.

9. The image sensor of claim 8, further comprising a second transmission transistor connected to the second photodiode and the second floating diffusion node.

10. The image sensor of claim 9, further comprising a second switch transistor connected to both the first voltage node and the second voltage node.

11. The image sensor of claim 10, wherein the second photodiode has a relatively wide light receiving area than the first photodiode.

12. The image sensor of claim 11, wherein the second switch transistor is configured to be turned on in a reset section for the first floating diffusion node, and connect the first voltage node to the second voltage node.

13. The image sensor of claim 11, wherein the second switch transistor is configured to be turned on in a read-out section for at least one of the second floating diffusion node or the third floating diffusion node, and connect the first voltage node to the second voltage node.

14. The image sensor of claim 12, wherein the second switch transistor is configured to be turned on in a read-out section for at least one of the second floating diffusion node or the third floating diffusion node, and connect the first voltage node to the second voltage node.

15. A unit pixel circuit, comprising:
- a first photodiode;
- a second photodiode different from the first photodiode;
- a first floating diffusion node configured to accumulate charges generated in the first photodiode;
- a second floating diffusion node configured to accumulate charges generated in the second photodiode;
- a capacitor connected to the first floating diffusion node and configured to receive a first voltage from a first node;
- a first switch transistor connecting the first floating diffusion node to a third floating diffusion node;
- a reset transistor connected the third floating diffusion node and configured to connect to a second node;
- a gain control transistor connecting the second floating diffusion node to the third floating diffusion node; and
- a second switch transistor configured to be connected to both the first node and the second node.

16. The unit pixel circuit of claim 15, further comprising a drive transistor connected to the second floating diffusion node and configured to connect to a third node.

17. The unit pixel circuit of claim 16, wherein the drive transistor is configured to receive a second voltage from the third node, the first voltage being different from the second voltage.

18. The unit pixel circuit of claim 17, wherein the second photodiode has a relatively wide light receiving area than the first photodiode.

* * * * *